(12) United States Patent
Ikeda

(10) Patent No.: US 7,896,658 B2
(45) Date of Patent: Mar. 1, 2011

(54) APPARATUS AND METHOD FOR ADJUSTING POSITION OF ELECTRONIC COMPONENT

(75) Inventor: Hironobu Ikeda, Tokyo (JP)

(73) Assignee: NEC Corporation, Tokyo (JP)

( * ) Notice: Subject to any disclaimer, the term of this patent is extended or adjusted under 35 U.S.C. 154(b) by 74 days.

(21) Appl. No.: 12/216,957

(22) Filed: Jul. 14, 2008

(65) Prior Publication Data
US 2009/0068861 A1 Mar. 12, 2009

(30) Foreign Application Priority Data
Sep. 6, 2007 (JP) ............................... 2007-231859

(51) Int. Cl.
*G01R 31/02* (2006.01)
(52) U.S. Cl. .................... 439/71; 439/526; 439/489; 439/700; 439/924.1; 324/758; 33/503; 33/504
(58) Field of Classification Search ............... 439/71, 439/526, 489, 700, 924.1; 324/758; 33/503, 33/504
See application file for complete search history.

(56) References Cited

U.S. PATENT DOCUMENTS

| | | | | |
|---|---|---|---|---|
| 4,915,648 A * | 4/1990 | Takase et al. | ............... | 439/490 |
| 4,927,382 A * | 5/1990 | Huber | ........................ | 439/490 |
| 5,653,599 A * | 8/1997 | Stratas | ........................ | 439/73 |
| 5,997,344 A * | 12/1999 | Shinozaki | .................... | 439/489 |
| 6,086,411 A * | 7/2000 | Shinozaki | .................... | 439/489 |
| 6,334,780 B1 * | 1/2002 | Lyotard | ........................ | 439/70 |
| 6,422,894 B1 * | 7/2002 | Endo et al. | ................... | 439/489 |
| 6,929,505 B2 * | 8/2005 | He et al. | ...................... | 439/526 |
| 7,129,730 B2 * | 10/2006 | Liu et al. | ..................... | 324/758 |
| 2004/0175986 A1 * | 9/2004 | Liao et al. | ................... | 439/526 |
| 2004/0214470 A1 * | 10/2004 | Hori | ............................ | 439/489 |
| 2005/0095906 A1 * | 5/2005 | He et al. | ...................... | 439/526 |

* cited by examiner

*Primary Examiner*—Gary F. Paumen
(74) *Attorney, Agent, or Firm*—McGinn IP Law Group, PLLC

(57) ABSTRACT

An apparatus, includes a plurality of pins which include a longitudinal axis, each of the pins to be respectively electronically contacted with each of a plurality of terminals of an electronic component by pressing each of the terminals onto each of the pins from a direction corresponding to the longitudinal axis, and an adjusting unit which adjusts a position of the electronic component so that each of the terminals corresponds to each of the pins respectively.

15 Claims, 15 Drawing Sheets

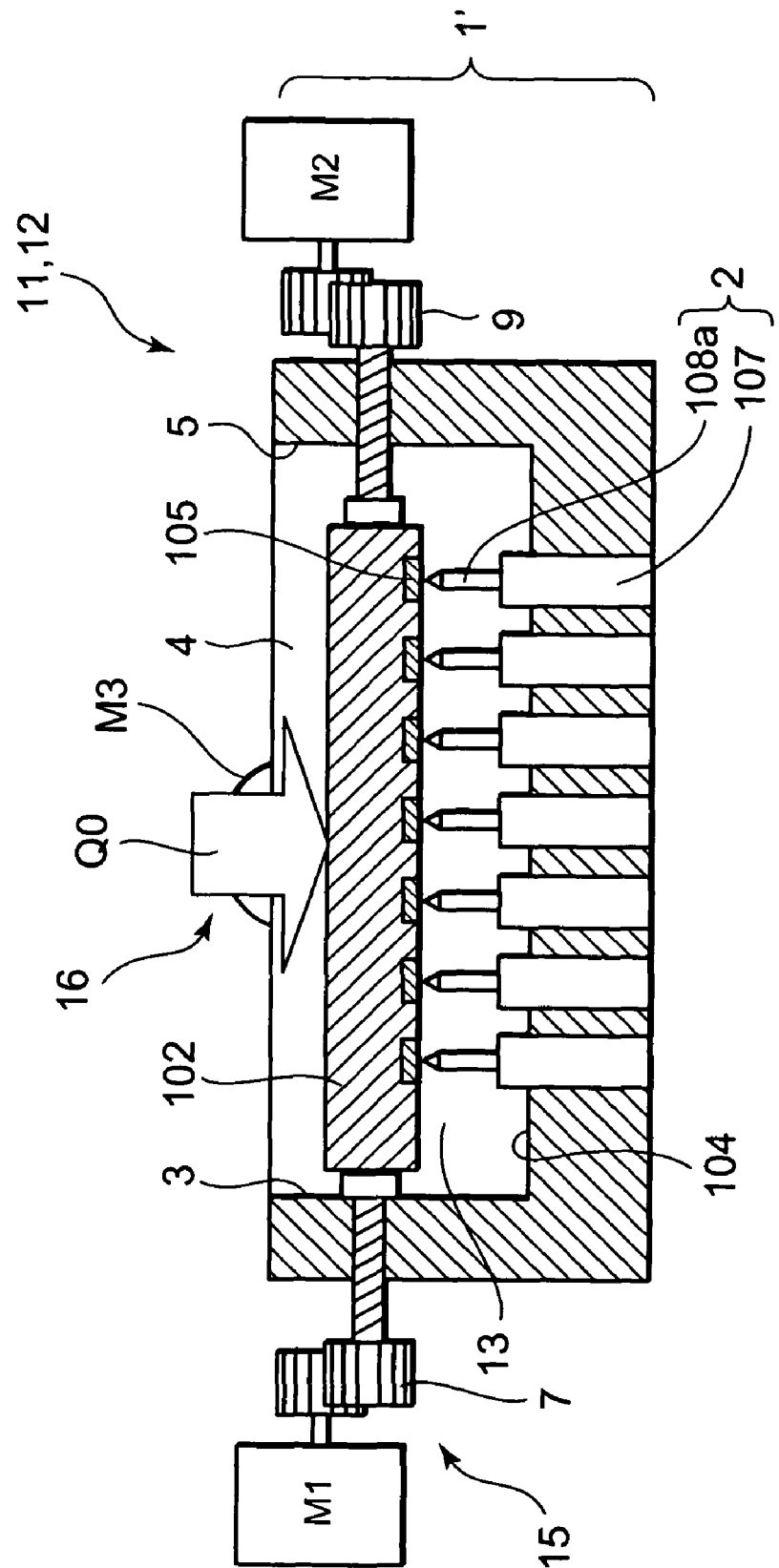

APPARATUS AND METHOD FOR ADJUSTING POSITION OF ELECTRONIC COMPONENT

INCORPORATION BY REFERENCE

This application is based upon and claims the benefit of priority from Japanese patent application No. 2007-231859, filed on Sep. 6, 2007, the disclosure of which is incorporated herein in its entirety by reference.

BACKGROUND OF THE INVENTION

1. Field of the Invention

The present invention relates to an improvement of a socket for high density terminals utilized when an electronic component (e.g., a land grid array type LSI package) in which an integrated circuit is built, is mounted on a wiring board, a method of mounting the electronic component using the socket for high density terminals and an electronic component adjusting unit.

2. Description of Related Art

The number of signal pins is expected to be increased to enable an integrated circuit such as a processor of a computer to process huge information at high speed in short time. Further, since densification also progresses, a pitch between signal pins tends to be narrowed. As an example of an electronic component the densification of which progresses, there is a land grid array type LSI package (hereinafter merely called "LGA"). The LGA is not directly soldered on a wiring board. The LGA is mounted on the wiring board utilizing a socket for high density terminal pins. The socket is called an "LGA socket". The LGA socket is used for enabling easy attachment and detachment of the LGA to/from the wiring board. The LGA socket is attached to an inspection equipment and a computer, so as to attach the LGA to the inspection equipment utilized for inspecting LGA, or so as to attach and detach a replaceable computer card.

FIG. 11 shows an example of mounting the LGA using a general LGA socket. The LGA socket 101 includes a concave space 103 for inserting an LGA 102. The LGA socket 101 includes plural pins 106 individually contacting each of plural terminals 105 arranged on one surface of the LGA 102. The pins 106 are installed on the bottom 104 of the concave space 103. Each of the pin 106 includes a sleeve 107 and a needle 108. Each needle 108 is independently forced toward the LGA 102 by a spring installed inside the sleeve 107. A contact 109 protruded downward from the sleeve 107 on the side of a board of the LGA socket 101 pierces a lower surface of the socket 101 and is exposed outside, and contacts a terminal 111 of the wiring board 110. Internal wiring 112 is provided to the wiring board 110, and the terminal 111 is connected to the internal wiring 112.

A positioning pin 113 is installed on the lower surface of the LGA socket 101. The position of the LGA socket 101 to the wiring board 110 is adjusted by inserting the positioning pin 113 into a positioning hole 114 on the side of the wiring board 110.

For inserting the LGA 102 into the wiring board 110, first, the positioning pin 113 is inserted into the positioning hole 114, the contact 109 is precisely positioned on the terminal 111 of the wiring board 110, and the LGA socket 101 is fixed to the wiring board 110.

Next, the LGA 102 is inserted into the concave space 103, and the terminal 105 of the LGA 102 and an end of the pin 106 are contacted with each other by pressing the LGA 102 toward the bottom 104 of the concave space 103 with a load Q1 as shown in FIG. 12, so as to conduct electricity between the pins 106 and the terminals 105. The terminal 111 of the wiring board 110 and the contact 109 on the side of the board of the LGA socket 101 are contacted so as to conduct electricity between the terminal 111 and the contact 109. The LGA 102 is fixed to the concave space 103 by pressing by the load Q1. The positioning pin 113 is fixed to the positioning hole 114, and the LGA socket 101 is fixed to the wiring board 110.

The needles 108 urged toward the electronic component by the spring installed inside the sleeve 107, contact the terminals 105, and then retract inside the sleeves 107 against the force of the spring. Since the needles 108 retract inside the sleeve 107, an overlapped part of an inner surface of the sleeve 107 and a peripheral surface of the needle 108 is increased. In other words, an area that the needles 108 and the sleeves 107 electrically contact with each other is increased. Further, since the needles 108 are pressed toward the terminals 105 by the force caused by compressing the spring, electricity can be securely conducted between the needle 108 and the terminal 105.

However, when the number of the terminals 105 of the LGA 102 increases, a pitch between the terminals 105 is necessarily narrowed, and the area of the terminal 105 is also reduced. Normally, a discrepancy for the wiring pitch may not be caused. However, due to a dimensional deviation, a discrepancy for the position of the terminals 105 may occur. In such a case, the LGA socket 101 which adjusts the position of the terminals 105 with respect to the pins 106 based on a size of the LGA socket 101 and a size of the electronic component 102 may cause a problem regarding the discrepancy of the position of the terminals 105 with respect to the pins 106.

FIG. 13 shows a case of a large discrepancy of the position of the terminals 105 with respect to the pins 106. When the terminals 105 are displaced with respect to the pins 106 in a direction substantially parallel to the LGA 102 as shown in FIG. 13, the end of the pin 106 and the terminal 105 of the LGA 102 are not matched when the LGA 102 is inserted into the LGA socket 101. In this case, even if the LGA 102 is pressed toward the pins 106 with the load Q1 as shown in FIG. 14, normal conduction may not occur. The discrepancy of the position of the terminals 105 with respect to the pins 106 may be caused in not only in a direction corresponding to a width direction of the LGA 102, but also in a direction corresponding to a depth direction of the LGA 102.

The discrepancy of the position of the terminals 105 with respect to the pins 106 may be solved by increasing an accuracy of manufacturing the LGA 102. However, increasing the accuracy of manufacturing causes an increase in cost of the LGA 102.

Therefore, an LGA socket that enables reliable conduction even if there is a discrepancy of the position of the terminals 105 with respect to the pins 106 is needed.

A related art (patent document 1) adjusts a position of terminals by inserting plural positioning pins 116 provided on an terminal surface 115 of LGA 102 into each hole 118 on the side of a socket 117 (FIGS. 15(a) and 15(b)). The positioning pin 116 is required to be attached to the terminal surface 115 of the LGA 102, and the cost may be increased.

In a patent document 2, a system includes a small-sized camera 120 buried in a socket for inspection 119. An external terminal of a semiconductor device 121 is photographed by the small-sized camera 120. A result of recognizing the image is displayed on an output device 123 after the image is recognized by an image recognizing device 122, and the semiconductor device 121 is displaced to a desired position of the socket for inspection 119 by operating a cross slide 124 (FIG.

16). High precision is required for this system, however. Further, the small-sized camera 120, required to be arranged for every the socket for inspection 119, is a high-priced inspection equipment. Therefore, it is difficult to apply this system to a purpose except inspection, for example, a wiring board on which the semiconductor device 121 is mounted.

[Patent document 1] JP-A-2003-078059
[Patent document 2] JP-A-2006-023166

SUMMARY OF THE INVENTION

According to one exemplary aspect of the present invention, an apparatus includes a plurality of pins which include a longitudinal axis, each of the pins to be electronically contacted with each of a plurality of terminals of an electronic component by pressing each of the terminals onto each of the pins from a direction corresponding to the longitudinal axis, and an adjusting unit which adjusts a position of the electronic component so that each of the terminals corresponds to each of the pins, respectively.

According to another exemplary aspect of the present invention, a method includes inserting a electronic component including a plurality of terminals into a socket which includes a plurality of pins including a longitudinal axis from a direction corresponding to the longitudinal axis, and adjusting a position of the electronic component so that each of the terminals corresponds to each of the pins, respectively.

BRIEF DESCRIPTION OF THE DRAWINGS

Other exemplary aspects and advantages of the invention will be made more apparent by the following detailed description and the accompanying drawings, wherein:

FIG. 4 shows a second exemplary embodiment of the present invention;

DETAILED DESCRIPTION OF THE EXEMPLARY EMBODIMENT

The invention provides a socket for high density terminals including a structure that secures electric contact between terminal of an electronic component and a pin of the socket for high density terminals, even if there is a discrepancy of a position of the terminals with respect to the pins.

Figure 1:
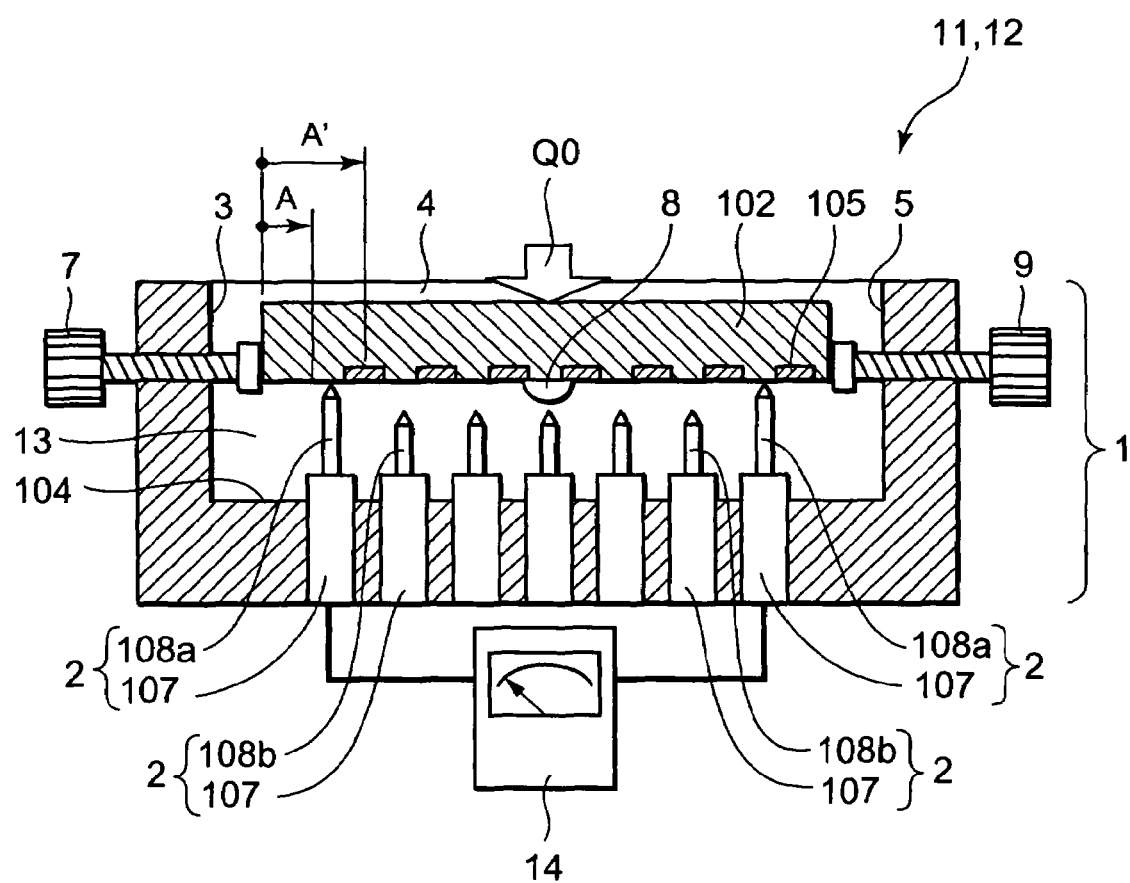
FIG. 1 shows a first exemplary embodiment of the present invention.

FIG. 1 shows an exemplary configuration of a first exemplary embodiment.

The LGA socket 1 includes a plurality of pins 2 and concave space 13. Each of the pins 2 contacts with terminals 105 of the electronic component, for example a land grid array type LSI package (hereinafter merely called "LGA 102"). The LGA 102 is inserted into the concave space 13.

The pins 2 are fixed to a bottom 104 of the concave space 13. The pins 2 include a needle 108a and a sleeve 107, or include a needle 108b and the sleeve 107. Each of the needles 108a and 108b is forced toward the LGA 102 by a spring installed inside the sleeve 107. Each of the needles 108a and 108b includes a longitudinal axis. The needle 108a includes a longer axis than that of the needle 108b in an outside of the sleeve 107. In other words, the portion sticking out from the sleeve 107 of the needle 108a is longer than that of the needle 108b.

The needle 108a is arranged on at least three of four corners of an array formed by the plurality of pins 2. However, the position at which the needle 108a is arranged is not limited to the corner(s) of the array. In the exemplary embodiment, four needles 108a are arranged at each of the four corners of the array.

When the position of the terminals 105 is misaligned with respect to an outer dimension of the LGA 102, the discrepancy of the position of the terminals 105 with respect to the pins 2 may occur. Therefore, in the present invention, the dimension of the concave space 13 is larger than the dimension of the LGA 102. The difference between the concave space 13 and the LGA 102 is substantially equal to a maximum position discrepancy. The maximum position discrepancy indicates the maximum positional discrepancy of the terminals 105 with respect to the outer dimension of the LGA 102.

A detailed example of the maximum positional discrepancy may be described below.

An "A" shown in FIG. 1 indicates a desirable position that the terminal 105 on the edge low of the array formed by the terminals 105 is to be installed on. If the terminal 105 may be installed on the position substantially equal to the desirable position, then the discrepancy of the position of the terminals 105 with respect to the pins 2 may not occur.

In the example shown in FIG. 1, the terminal 105 on the edge row is installed on the position apart a distance "A'" from an edge of the LGA 102. In other words, the position that the terminal 105 on the edge row is installed on, is misaligned by a distance |A'−A|. The "|A'−A|" indicates an absolute value corresponding to a difference between the distance "A'" and the distance "A". It is assumed that the "A'" may be a maximum misalignment caused by some kind of irregular events (e.g., inaccuracy of manufacturing, etc). Under the assumption, the "|A'−A|" may be the maximum positional discrepancy.

The dimension of the concave space 13 may be larger than the dimension of the LGA 102 by at least the maximum positional discrepancy "|A'−A|". In FIG. 1, the misalignment occurs toward a direction corresponding to a center of the LGA 102 as an example. However, if there is possibility that the misalignment occurs toward the direction corresponding to the center of the LGA 102 or a direction corresponding to an edge of the LGA 102, then the maximum positional discrepancy may be twice the "|A'−A|" (i.e., 2*|A'−A|).

The LGA socket 1 includes walls 3, 4, 5 and 6 (the wall 6 is not shown in FIG. 1). The walls 3, 4, 5, and 6 surround the concave space 13. In this exemplary embodiment, package adjusting screws 7, 8, 9 and 10 are installed on walls 3, 4, 5 and 6, respectively. The package adjusting screw 10 is not shown in FIG. 1 similarly to the wall 6. Each of package adjusting screws 7, 8, 9 and 10 penetrate through the walls 3, 4, 5 and 6, respectively. The length of an effective threaded portion of each package adjusting screw 7, 8, 9, 10 has redundancy and any end of each package adjusting screw 7, 8, 9, 10 can reach to the outline of the LGA 102. By turning (threading) each of the package adjusting screws 7, 8, 9 and 10, each of the package adjusting screws 7, 8, 9 and 10 moves for sticking (touching) or retracting the package adjusting screw 7, 8, 9 and 10 with respect to the walls 3, 4, 5 and 6, respectively.

An adjusting unit 11 includes the concave space 13, the package adjusting screws 7, 8, 9, 10 and the walls 3, 4, 5, 6. The adjusting unit 11 adjusts a mounted position of the LGA 102 in any direction parallel to the row of the terminals 105 and in any direction parallel to the row of the pins 2.

A mounted position fixing unit 12 for fixing the LGA 102 in an adjusted position by the adjusting unit 11 includes the package adjusting screws 7, 8, 9, 10. Each of the adjusting screws 7, 8, 9 and 10 is configured contactable with the edge of the LGA 102.

The LGA socket 1 is provided with contacts on the side of a board for touching to terminals (111, in FIG. 11) on the side of the wiring board on which the LGA socket 1 is to be mounted and positioning pins (113, in FIG. 11) utilized for positioning when the LGA socket 1 is mounted on the wiring board like the LGA socket 101 described referring to FIGS. 11 to 14. However, as these components are well-known, description in the drawings and the explanation are omitted.

Next, a procedure for mounting the LGA 102 using the LGA socket 1 will be described.

First, a detector 14 such as a tester, is connected to check conduction between each of the needles 108*a*, which is longer than the needle 108*b*, arranged at the corner of the array formed by the pins 2. In other words, the detector 14 detects whether each of the needles 108*s* contacts with the corresponding one of the terminals 105 or not.

In FIG. 1, the detector 14 is directly connected to the pin 2 provided with the relatively long needle 108*a*. However, actually, the detector 14 may be connected via internal wiring of the wiring board (not shown) on which the LGA socket 1 is mounted. For detecting the conduction, dedicated conduction wiring may be also installed inside the LGA 102 or the input-output impedance of a signal pin of the integrated circuit is measured and conduction may be also checked. The detector 14 may be embedded into the LGA socket 1.

The LGA 102 is installed in the concave space 13 of the LGA socket 1, as shown in FIG. 1. The corners of the LGA 102 corresponding to each of the needles 108*a* are supported by needles 108*a*, and the LGA 102 is forced (biased, urged) toward the bottom 104 of the concave space 13 with a load Q0. Under an assumption that the LGA 102 is supported by four needles 108*a*, if minimum force required for securing electrical conduction between each of the needles 108*a* and the corresponding one of the terminals 105 is 0.5 N. Then the load Q0 is equivalent to four times of the minimum force, that is, 2 N.

The needle 108*a* slightly goes down by the load Q0 against the force toward the LGA 102 generated by the spring of the sleeve 107. The LGA 102 is also displaced downward. However, the needles 108*b*, which are shorter than the needle 108*a*, have not contacted yet with the corresponding terminals 105 of the LGA 102.

Next, the position of the LGA 102 is adjusted by using the adjusting unit 11 so that the detector 14 detects the electrical conduction between the needles 108*a* and the corresponding terminals 105. When the detector 14 detects the electrical conduction, the position of the LGA 102 is adjusted to a desirable position.

For example, when the adjusting unit 11 adjusts the position of the LGA 102 in a direction parallel with respect to a sectional figure shown in FIG. 1, the package adjusting screws 7, 9 adjust the position of the LGA 102. The package adjusting screws 7 and 9 contact with the edge of the LGA 102. In other words, the LGA 102 is pinched (e.g., pressed) by the package adjusting screws 7 and 9. Then, the package adjusting screws 7 and 9 move toward a same direction with substantially synchronization with each other. By the movement of the package adjusting screws 7 and 9, the LGA 102 moves in synchronism with the movement of package adjusting screws 7 and 9.

For example, when the adjusting unit 11 adjusts the position of the LGA 102 in a perpendicular direction with respect to a sectional figure shown in FIG. 1, the package adjusting screws 8, 10 adjust the position of the LGA 102. The package adjusting screws 8 and 10 contact with the edge of the LGA 102. In other words, the LGA 102 is pinched (e.g., pressed) by the package adjusting screws 8 and 10. Then, the package adjusting screws 8 and 10 move toward a same direction with substantially synchronization with each other. By the movement of the package adjusting screws 8 and 10, the LGA 102 moves in synchronism with the movement of package adjusting screws 8 and 10.

Since only the four needles 108*a* contact with the lower surface of the LGA 102 with each force of 0.5 N, a frictional resistance generated between the end of the needles 108*a* and the lower surface of the LGA 102 is relatively small. Therefore, the LGA 102 easily moves against the frictional resistance, and the lower surface of the LGA 102 and the terminals 105 are not damaged.

If the length of all of pins 2 are the same, then all the pins 2 simultaneously contact with the lower surface of the LGA 102. If it is assumed that the number of the total pins 2 is 500, then the force of 250 N is exerted between the pins 2 and the LGA 102 as a total. It is remarkably difficult to make the LGA 102 move by the adjusting unit 11 under such a large force. When force that acts on each of pins 2 is reduced to solve this problem, the electrical conduction is turned insufficient even if positions of the pin 2 and the terminal 105 are completely matched. Therefore, a new problem arises that it is difficult to adequately check that the position of the pin 2 and the position of the terminal 105 are coincident on the detector 14.

In this exemplary embodiment, the reason why only the needles 108*a*, arranged at the corners of the array formed by the pins 2, are longer than the needles 108*b*, is to make the LGA 102 move easily and to enhance precision in detecting the electrical conduction between the needles 108*a* by the detector 14.

When the detector 14 detects that all of the four needles 108*a* contact the corresponding terminals 105 by adjusting the position of the LGA 102, the position is deemed to have been correctly adjusted by the adjusting unit 11.

Also, it is possible to determine a desirable position of the LGA 102 by detecting a desirable electrical conduction between the needles 108a and the corresponding terminals 105.

Figure 2:
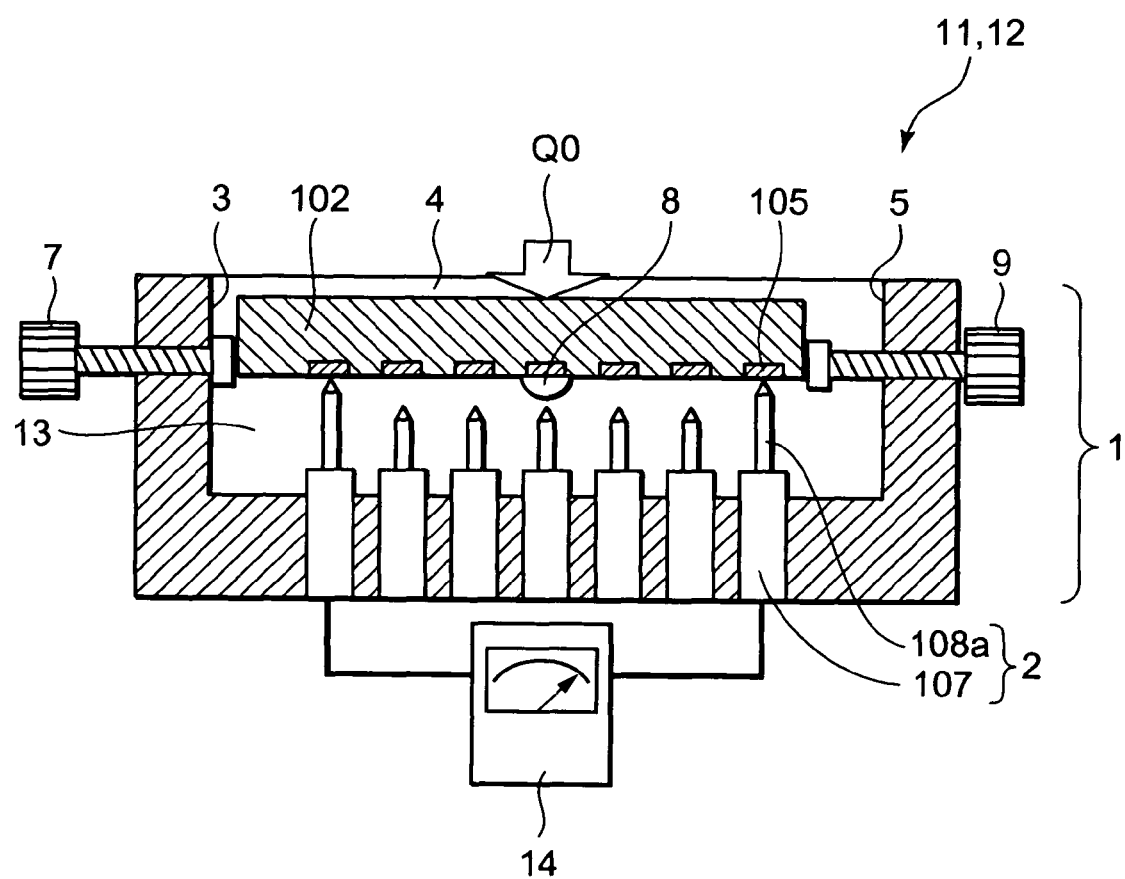
FIG. 2 shows an exemplary operation of the present invention.

By the above-mentioned procedure, the position of the pins 2 and the position of the terminals 105 are matched with each other. FIG. 2 shows this situation. Each of the needles 108a electrically conducts with the corresponding terminals 105 (see representation of display of detector 14).

Next, the LGA 102 is pressed by a load Q1 toward the bottom 104 of the concave space 13, and then all of the needles 108a and the needles 108b contact with the corresponding terminals 105. If the force required to secure electrical conduction between the pin 2 and one terminal 105 is 0.5 N and the number of the total pins 2 is 500, then the load Q1 is equivalent to 500 times of it, that is, is 250 N.

The package adjusting screws 7 and 9 work as the mounted position fixing unit 12. In other words, the package adjusting screws 7 and 9 pinch (e.g., press or sandwich) the LGA 102 by moving both of the package adjusting screws 7 and 9 toward the center of the LGA 102. Also, the package adjusting screws 8 and 10 work as the mounted position fixing unit 12. In other words, the package adjusting screws 8 and 10 pinch (e.g., press or sandwich) the LGA 102 by moving both of the package adjusting screws 8 and 10 toward the center of the LGA 102. By pinching the LGA 102 with the package adjusting screws 7, 8, 9 and 10, the LGA 102 has been fixed at the desirable position. Then, the load Q1 is removed.

Since the package adjusting screws 7, 8, 9 and 10 pinch the LGA 102, the LGA 102 has been fixed securely.

Next, a second exemplary embodiment will be described in below.

As shown in FIG. 4, driving units 15 and 16 are installed with respect to each of the package adjusting screws 7, 8, 9 and 10. The driving unit 15 corresponding to the package adjusting screws 7 and 9 drives the package adjusting screws 7 and 9, so that each of the package adjusting screws 7 and 9 moves toward a same direction. The driving unit 16 corresponding to the package adjusting screws 8 and 10 drives the package adjusting screws 8 and 10, so that each of the package adjusting screws 8 and 10 moves toward a same direction.

Figure 3:
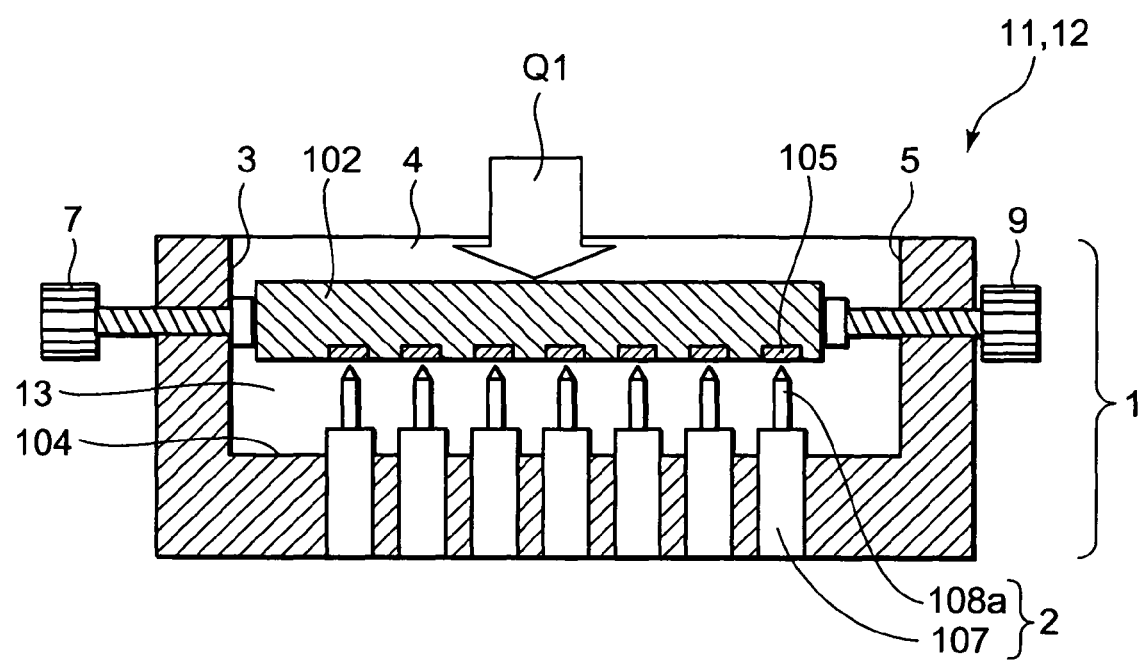
FIG. 3 shows an exemplary operation of the present invention.

In the exemplary embodiment shown in FIG. 4, the driving unit 15 includes motor M1 and M2 for driving the package adjusting screws 7 and 9, respectively. The driving unit 16, includes motor M3 and M4 for driving the package adjusting screws 8 and 10, respectively. As the other configuration is similar to that in the first exemplary embodiment described referring to FIGS. 1 to 3, the description is omitted. As FIG. 4 is a longitudinal section, the wall surface 6 on this side, the package adjusting screw 10 and the motor M4 are not shown.

When the LGA 102 moves in the parallel direction with respect to the sectional figure shown in FIG. 4, the package adjusting screws 7 and 9 move toward the same direction by being driven with a rotation of the motor M1 and M2. A velocity of the movement of the package adjusting unit 7 and 9 is determined by multiplying a load of a screw and a number of revolutions of the motor. A moving direction of the package adjusting screws 7 and 9 is determined by a direction of a thread of the screw and a rotary direction of the motor. The package adjusting screws 7 and 9 move in synchronization with each other with respect to the velocity of the movement and the moving direction.

When the LGA 102 moves in a perpendicular direction with respect to the sectional figure shown in FIG. 4, the package adjusting screws 8 and 10 move toward the same direction by being driven with a rotation of the motor M3 and M4. A velocity of the movement of the package adjusting unit 8 and 10 is determined by multiplying a load of a screw and a number of revolutions of the motor. A moving direction of the package adjusting screws 8 and 10 is determined by a direction of a thread of the screw and a rotary direction of the motor. The package adjusting screws 8 and 10 move in synchronization with each other with respect to the velocity of the movement and the moving direction.

Next, a third exemplary embodiment will be described in below.

In the first and second exemplary embodiment, the LGA socket 1 includes the package adjusting screws 7, 8, 9 and 10 for adjusting the position of the LGA 102 and the fixing the position of the LGA 102. So, for installing the LGA socket 1, more space is required.

Therefore, in the third exemplary embodiment, the structure of the LGA socket 1 may be more simplified. In the third exemplary embodiment, manufacturing cost also may be reduced, for example.

Figure 5A:
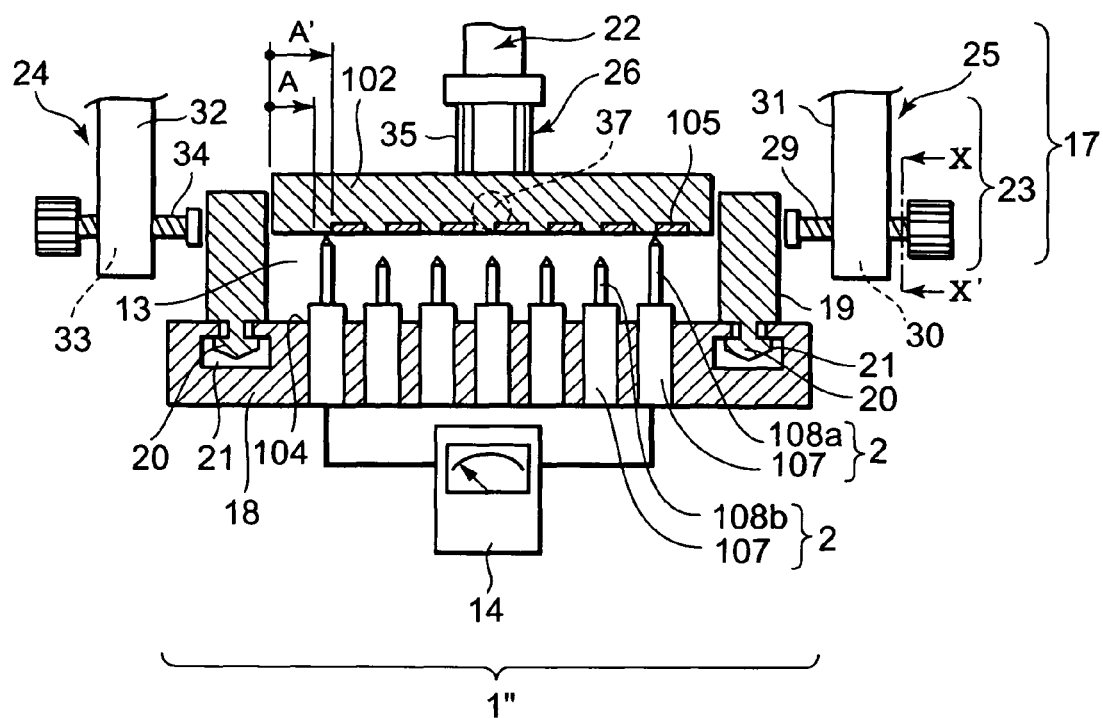
FIG. 5(a) shows a third exemplary embodiment of the present invention.

FIG. 5(a) is a sectional view showing a main part of the LGA socket 1" which does not include the package adjusting screw and the electronic component adjusting unit 17 (hereinafter merely called the "adjusting unit 17") for mounting the LGA 102 on the LGA socket 1". The adjusting unit 17 is a separate component from the LGA socket 1". In other words, the component for adjusting the position of the LGA 102 is not included in the LGA socket 1". Therefore, it is possible to simplify the structure of the LGA socket 1".

The LGA socket 1" includes a base member 18 forming the bottom 104 of the concave space 13 and a movable frame 19. The movable frame 19 surrounds the concave space 13. The base member 18 includes the pins 2.

Each of the pins 2 is inserted into the sleeve 107 similarly to the first and second exemplary embodiments. The sleeve 107 includes the spring in inside. Each of the pins 2 is forced toward the LGA 102 by the spring. The pins 2 include the needles 108a and the needles 108b as in the first and second exemplary embodiments.

The needle 108a is arranged on at least three of four corners of an array formed by the plurality of pins 2. However, the position at which the needle 108a is arranged is not limited in the corner of the array. In the third exemplary embodiment, four needles 108a are arranged at each of the four corners of the array.

A dimension of the movable frame 19 is formed in accordance with the dimension of the LGA 102. The LGA 102 has been inserted into the movable frame 19 and was been fixed by the movable frame 19.

The movable frame 19 is not removable from the base member 18. However, frame 19 is movable at least within a distance corresponding to the maximum positional discrepancy of the terminals 105 with respect to the outer dimension of the LGA 102.

An "A" shown in FIG. 5(a) indicates a desirable position that the terminal 105 on the edge row of the array formed by the terminals 105 to be installed on. If the terminal 105 may be installed on the position substantially equal to the desirable position, then the discrepancy of the position of the terminals 105 with respect to the pins 2 may not occur.

In the example shown in FIG. 1, the terminal 105 on the edge low is installed on the position apart by a distance "A'" from an edge of the LGA 102. In other words, the position that the terminal 105 on the edge row is installed on is misaligned by a distance |A'−A|. The "|A'−A|" indicates an absolute value corresponding to a difference between the distance "A'" and the distance "A". It is assumed that the "A'" may be a maximum misalignment caused by some kind of irregular events (e.g., inaccuracy of manufacturing etc). Under the assumption, the "|A'-A|" may be the maximum positional discrepancy.

The dimension of the concave space 13 may be larger than the dimension of the LGA 102 by at least the maximum positional discrepancy "|A'-A|". In FIG. 1, the misalignment occurs toward a direction corresponding to a center of the LGA 102 as an example. However, if there is possibility that the misalignment occurs toward the direction corresponding to the center of the LGA 102 or a direction corresponding to an edge of the LGA 102, then the maximum positional discrepancy may be twice the "|A'-A|" (i.e., 2*|A'-A|).

The base member 18 includes a hole 21 which includes a first diameter and a second diameter. The second diameter is larger than the first diameter. The movable frame 19 includes a projection 20 which is inserted into the hole 21. The projection 20 includes a first part and a second part. The first part corresponds to the first diameter of the hole 21, and the second part corresponds to the second diameter of the hole 21. The second part is inserted into a part of the hole 21 whose diameter corresponds to the second diameter. The first part is inserted into a part of the hole 21 whose diameter corresponds to the first diameter. The diameter of the second part is larger than the first diameter. Therefore, the movable frame 19 is not removable from the base member 18. Further, there is a first margin between the diameter of the first part and the first diameter, and there is a second margin between the diameter of the second part and the second diameter. Each of the first and second margins substantially corresponds to the maximum positional discrepancy. Therefore, the frame 19 is movable at least within a distance corresponding to the maximum positional discrepancy.

The adjusting unit 17 includes a pressure arm 22 which presses the LGA 102 toward the bottom 104, and a movable frame drive unit 23 which makes the movable frame 19 move to adjust the position of the LGA 102.

The movable frame drive unit 23 includes movable frame drive units 24, 25 for moving the movable frame 19 in a parallel direction with respect to the sectional figure shown in FIG. 5(a), and movable frame drive units 26, 27 for moving the movable frame 19 in a perpendicular direction with respect to the sectional figure shown in FIG. 5(a). The movable frame drive unit 27 is not shown in FIG. 5(a).

Figure 5B:
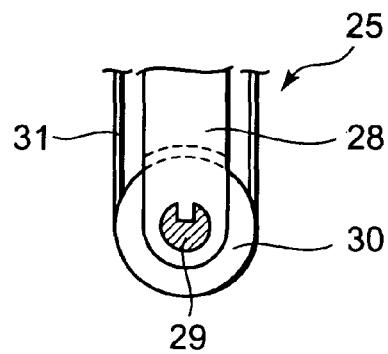
FIG. 5(b) shows an exemplary detailed configuration of the third exemplary embodiment of the present invention.

FIG. 5(b) is a sectional view of the movable frame drive unit 25. FIG. 5(b) is a view seen from a direction perpendicular to a section cut along a line X-X' shown in FIG. 5(b). The movable frame drive unit 25 includes a stay 28 fixed to an elevating/lowering head (not shown), a screw 29 attached to a lower end of the stay 28 so that the screw 29 cannot be radially moved and can be axially moved, a socket 30 jointed with the screw 29 so that the socket 30 can be radially moved together with the stay 28 and cannot be axially moved, and a timing belt 31 fitting on the periphery of the socket 30. By rotating the socket 30 in a constant position, the screw 29 moves in the parallel direction with respect to the sectional figure shown in FIG. 5(a).

The movable frame drive unit 24, 26 and 27 is configured as same as the movable frame drive unit 25

The timing belt 31 of the movable frame drive unit 25 and the timing belt 32 of the movable frame drive unit 24 are driven by a servo motor Mx which is not shown in FIGS. 5(a)-5(b). By being driven with the servo motor Mx, the screw 29 of the movable frame drive unit 25 and the screw 34 of the movable frame drive unit 24 move in the parallel direction with respect to the sectional figure shown in FIG. 5(a). The LGA 102 moves in a direction corresponding to the direction of the movement of the screws 29, 34.

The timing belt 35 of the movable frame drive unit 26 and the timing belt 36 of the movable frame drive unit 27 are driven by a servo motor My which is not shown in FIGS. 5(a)-5(b). By being driven with the servo motor My, the screw 37 of the movable frame drive unit 26 and the screw 38 of the movable frame drive unit 27 move in the perpendicular direction with respect to the sectional figure shown in FIG. 5(a). The LGA 102 moves in a direction corresponding to the direction of the movement of the screws 37, 38. The movable frame drive unit 27, the screw 38 and timing belt 36 are not shown in FIGS. 5(a)-5(b).

The pressure arm 22 is driven vertically by a linearly driving device not shown, such as a ball nut and a screw. A servo motor Mp drives the linearly driving device such as a ball nut and a screw. The servo motor Mp is housed inside an elevating/lowering head (not shown in FIG. 5(a)-5(b)) together with the servo motor Mx and the servo motor My. The elevating/lowering head drives the movable frame drive unit 24, 25, 26 and 27, the pressure arm 22 vertically. A servo motor Mz drives the elevating/lowering head.

Figure 6:
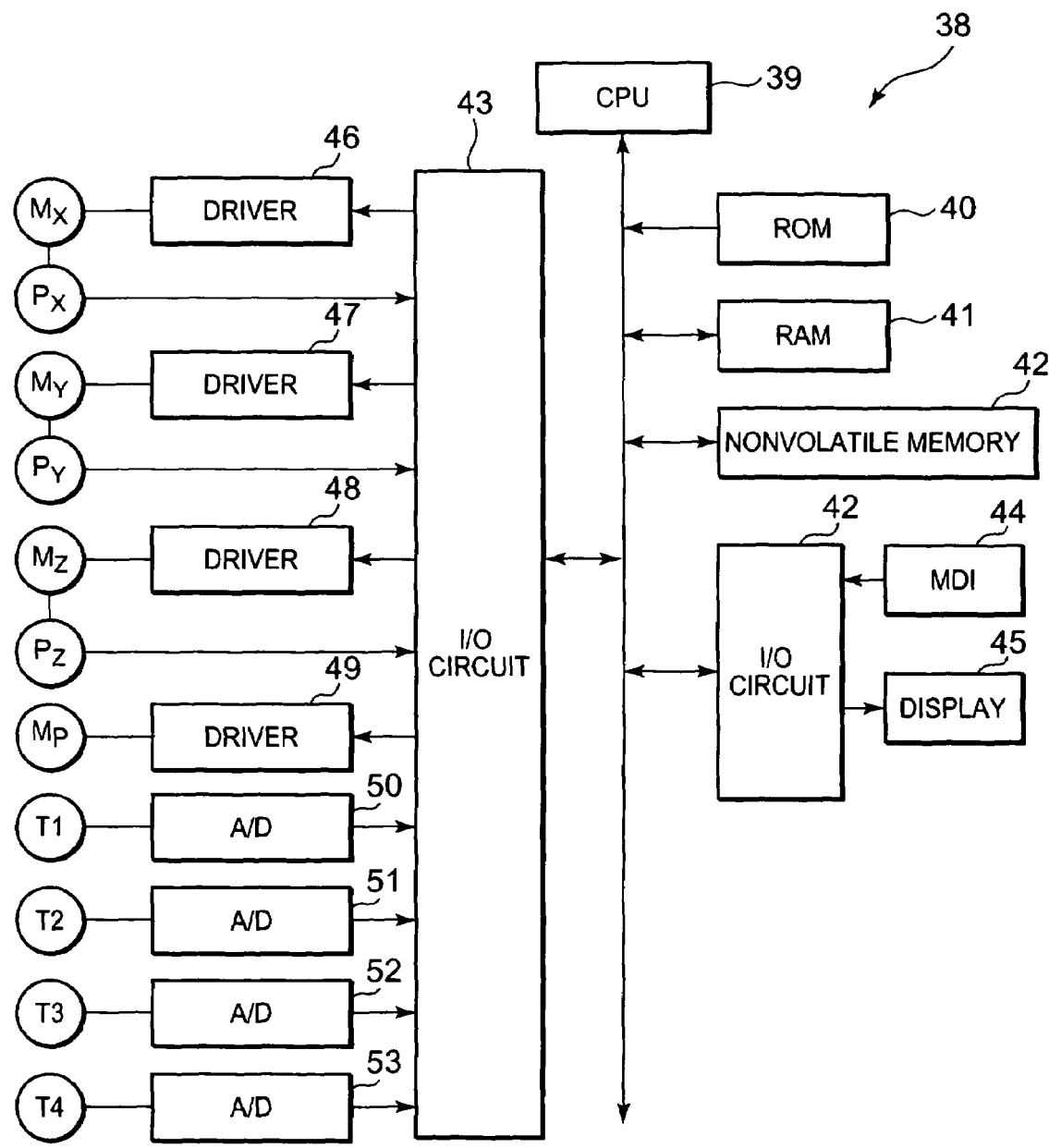
FIG. 6 shows an exemplary detailed configuration of the exemplary third embodiment of the present invention.

FIG. 6 is a block diagram showing an exemplary configuration of a controller 38 of the adjusting unit 17.

The controller 38 includes a microprocessor 39, a ROM 40 that stores a control program for the controller 38, a RAM 41 utilized for temporarily storing arithmetic data and a nonvolatile memory 42 that stores various parameters, and a manual console panel 44 for inputting a boot signal and others for operating the adjusting unit 17 and a display 45 for displaying various measurement data and others are connected to an input-output circuit 43 of the microprocessor 39.

The servo motors Mx, My, Mx and Mp are driven by the microprocessor 39 via the input-output circuit 43 and drivers 46, 47, 48, 49.

Pulse coders Px, Py, Pz that detect an absolute position on each axis in a machine coordinate system of the adjusting unit 17 are placed together with the servo motor Mx, the servo motor My and the servo motor Mz so as to enable the microprocessor 39 to recognize the current position on each axis based upon feedback signals from the pulse coders Px, Py, Pz. The microprocessor 39 detects current for driving the servo motor Mp via the driver 49 of the servo motor Mp and computes reaction torque that acts on the servo motor Mp, and, force with which an end of the pressure arm 22 presses the LGA 102 based upon the driving current.

As in the case shown in FIG. 1 in the first exemplary embodiment, the detector 14 is installed in the LGA socket 1". Signals T1, T2, T3, T4 showing conduction between the needles 108a arranged at the four corners and the terminal 105 of the LGA 102 corresponding to each of the corresponding needles 108a are read by the microprocessor 39 from the detector 14 via A/D converters 50, 51, 52, 53 and the input-output circuit 43. In this embodiment, T1, T2, T3, T4 are voltage signals output according to conduction and as the conduction becomes proper, a value of output voltage also increases.

Figure 7:
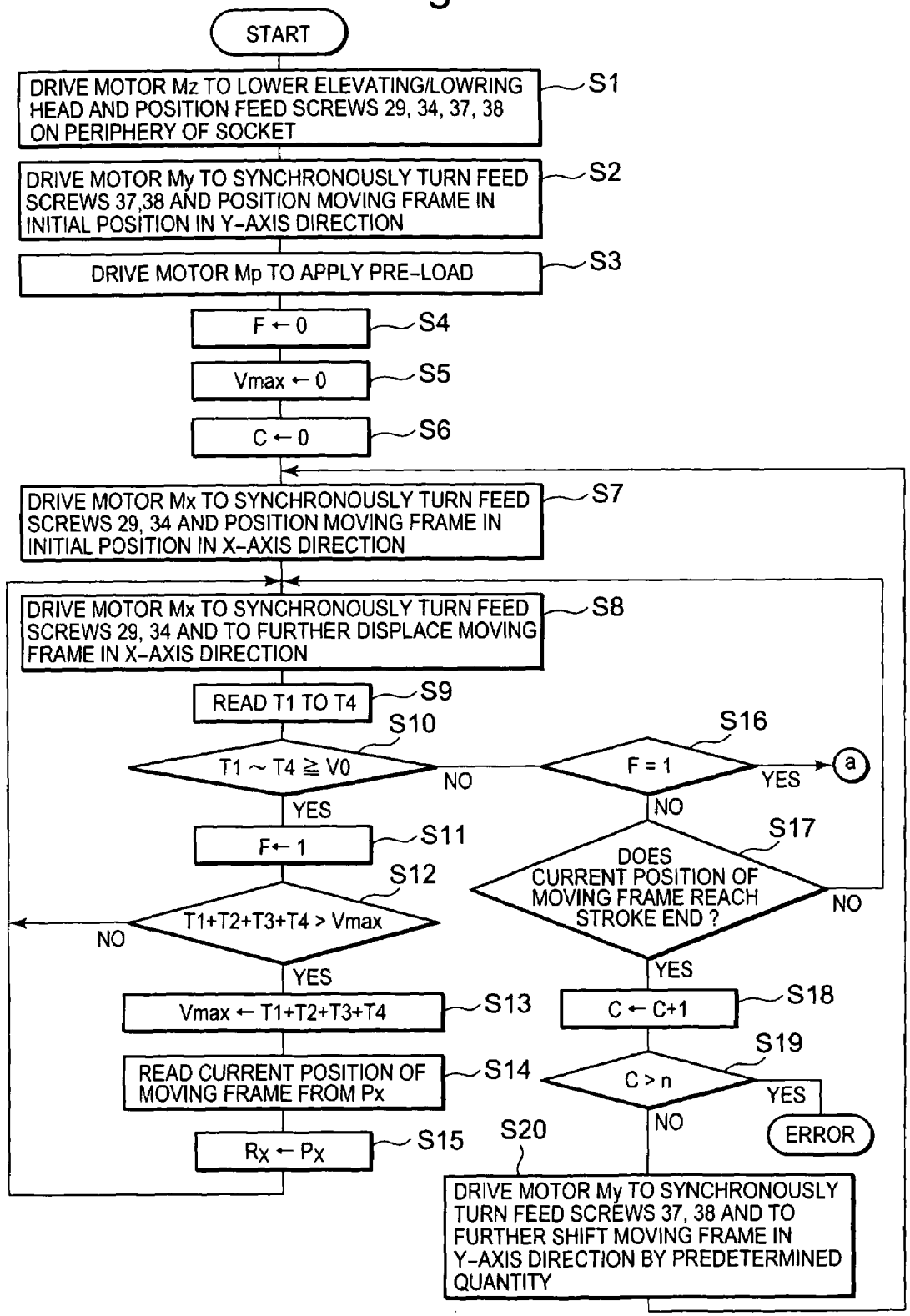
FIG. 7 is a flowchart showing an exemplary operation of the third exemplary embodiment.
Figure 8:
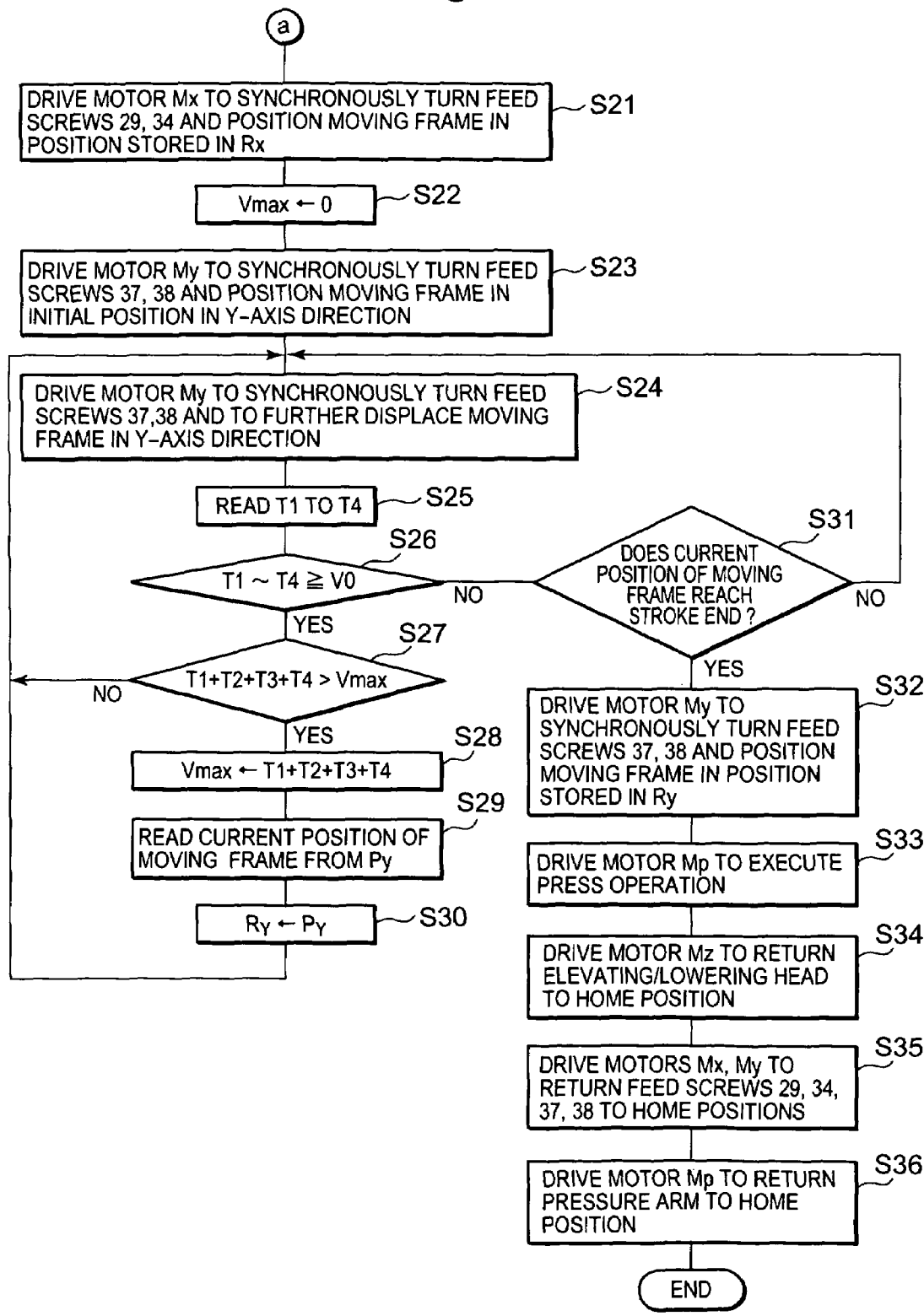
FIG. 8 is a flowchart showing an exemplary operation of the third exemplary embodiment.

FIGS. 7 and 8 are flowcharts showing an exemplary process executed by the microprocessor 39 of the controller 38 provided to the adjusting unit 17.

Next, referring to the flowcharts shown in FIGS. 7 and 8, processing by the microprocessor 39 that functions as a preload control device, a first position component specifying device, a second position component specifying device, a movable frame positioning device and a press-fit control device and a method of mounting the LGA 102 using the LGA socket 1", will be described in detail.

The elevating/lowering head of the adjusting unit 17 may be located in a retracted position over the LGA socket 1" in an initial state. It is assumed that the wiring board on which the LGA socket 1" is already mounted is clamped on a table of the adjusting unit 17, and the LGA 102 to be mounted may be installed in the concave space 13 of the LGA socket 1".

Next, when a user operates the manual console panel 44 and inputs a boot signal to the controller 38 of the adjusting unit 17, the microprocessor 39 that detects the input of the boot signal first drives the servo motor Mz so as to lower the elevating/lowering head of the adjusting unit 17 and positions the ends of the screws 29, 34, 37, 38 on a periphery of each movable frame 19 of the LGA socket 1", as shown in FIG. 5(*a*) (at step s1).

Next, the microprocessor 39 drives the servo motor My to synchronously turn the screws 37, 38, and positions each movable frame 19 in an initial position in the perpendicular direction with respect to the sectional figure shown in FIG. 5(*a*) (at step s2).

The initial position means a position in which the movable frame 19 is displaced on this side in the perpendicular direction with respect to the sectional figure shown in FIG. 5(*a*) from a reference position in design by quantity equivalent to maximum positional discrepancy of a position for each terminal 105 to be arranged based upon the outline of the LGA 102. Therefore, it is greatly possible in view of correspondence between the pin 2 of the LGA socket 1" and the terminal 105 on the side of the LGA 102 corresponding to the corresponding pin 2 that the terminal 105 is located on this side of the pin 2 in the perpendicular direction with respect to the sectional figure shown in FIG. 5(*a*). However, it is impossible that the terminal 105 is located at the back of a position of the pin 2 in the perpendicular direction with respect to the sectional figure shown in FIG. 5(*a*).

Figure 9:
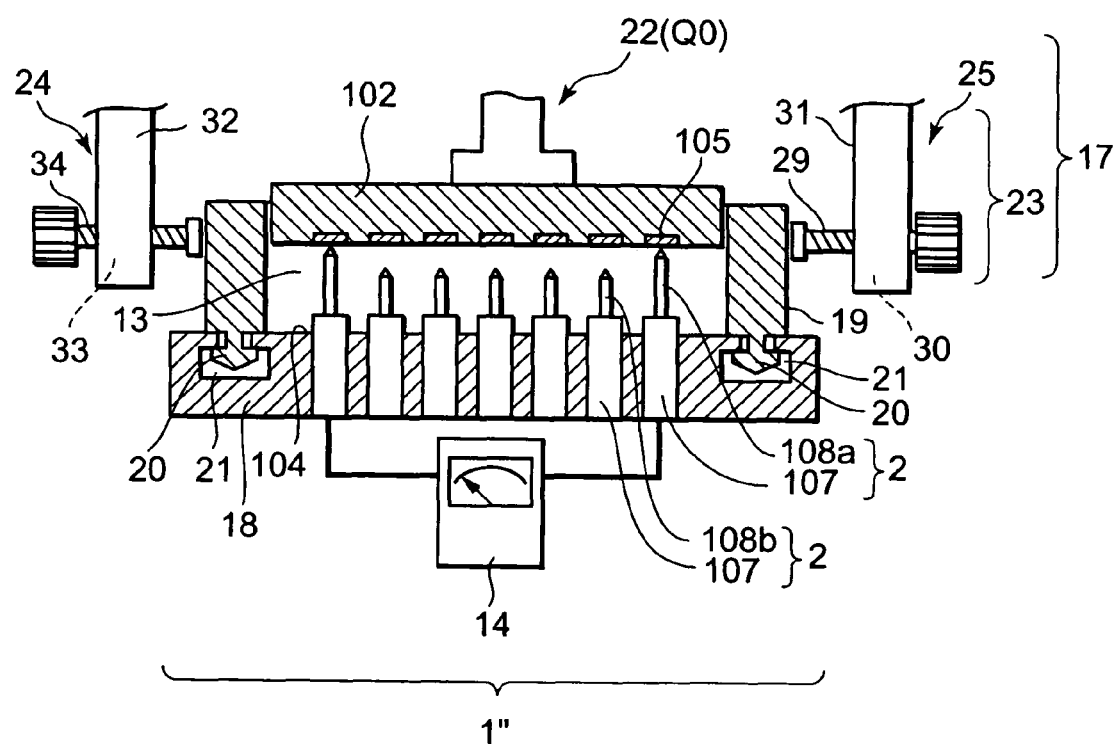
FIG. 9 shows an exemplary operation of the third exemplary embodiment of the present invention.
Figure 10:
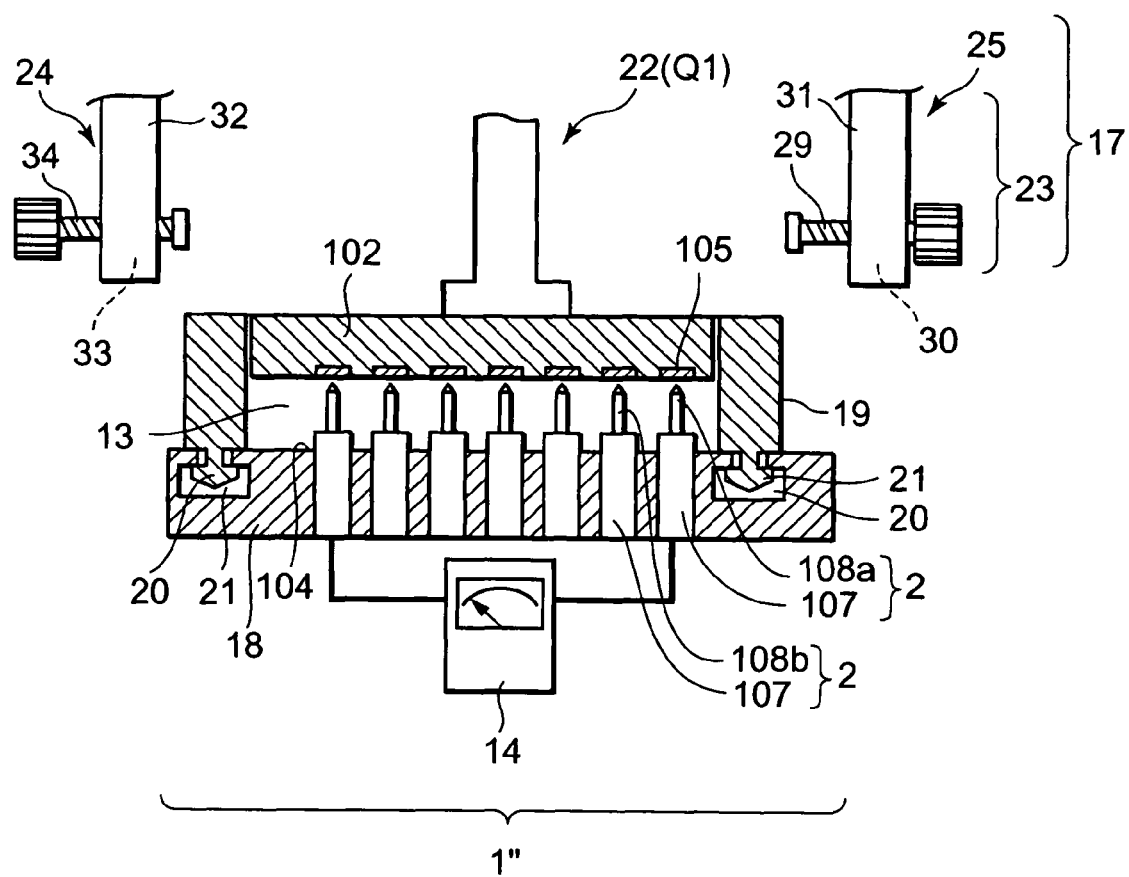
FIG. 10 shows an exemplary operation of the third exemplary embodiment of the present invention.
Figure 11:
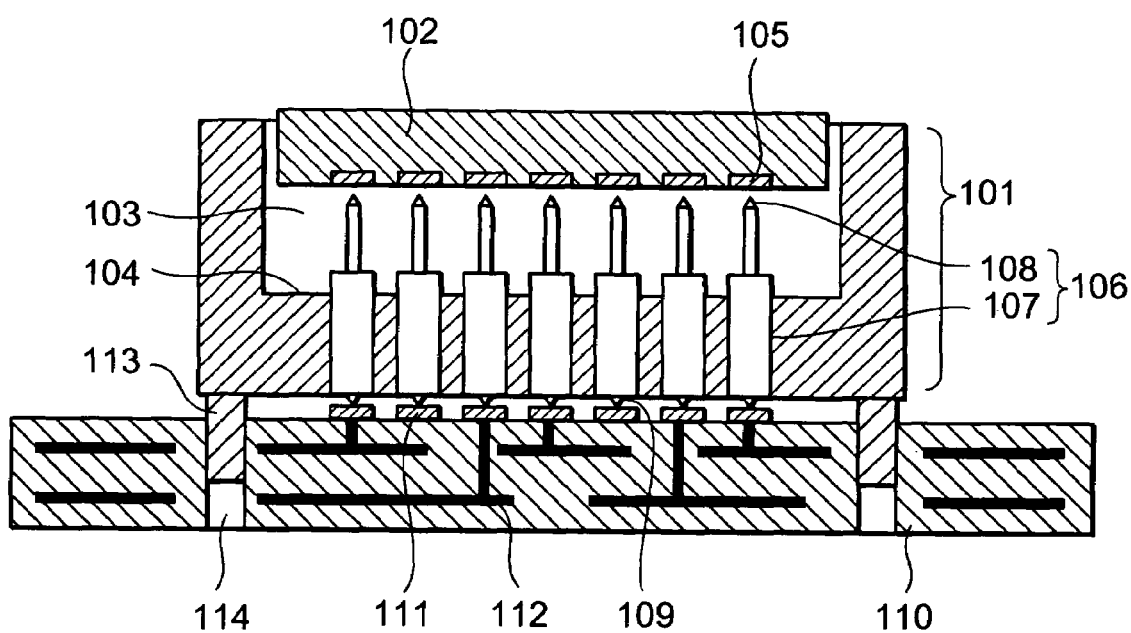
FIG. 11 shows a configuration of a related art.
Figure 12:
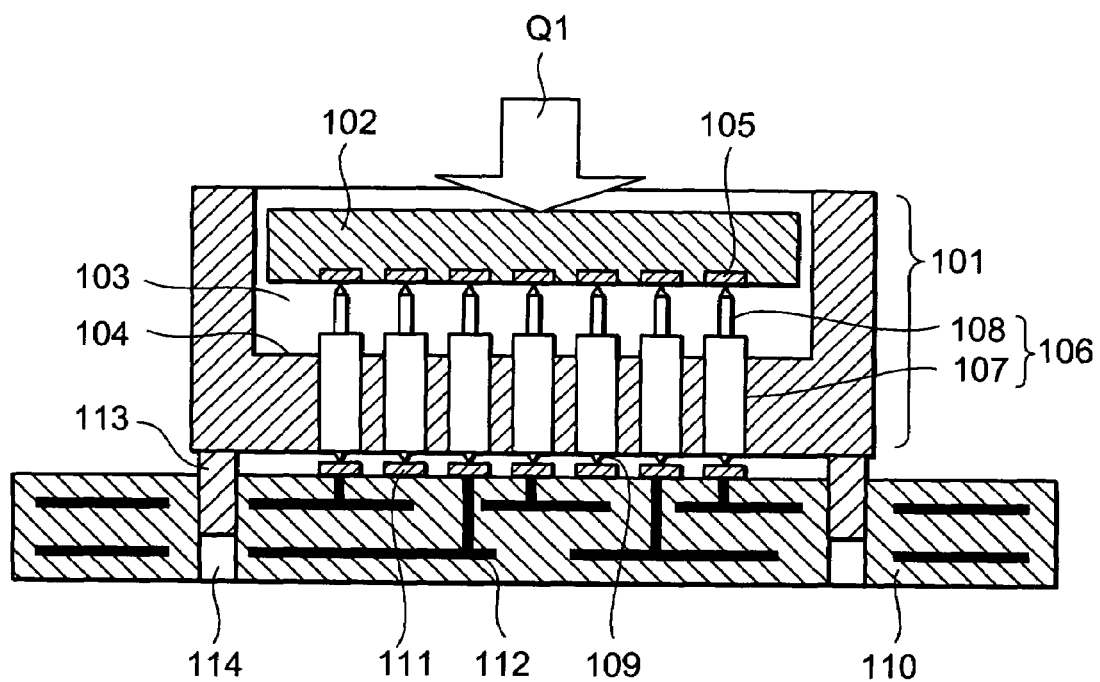
FIG. 12 shows an operation of the related art.
Figure 13:
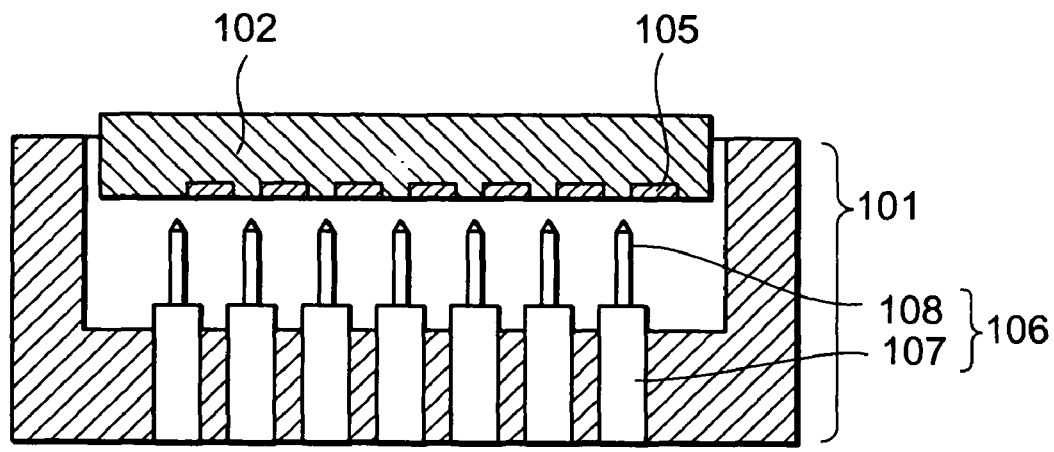
FIG. 13 shows a problem caused in the related art.
Figure 14:
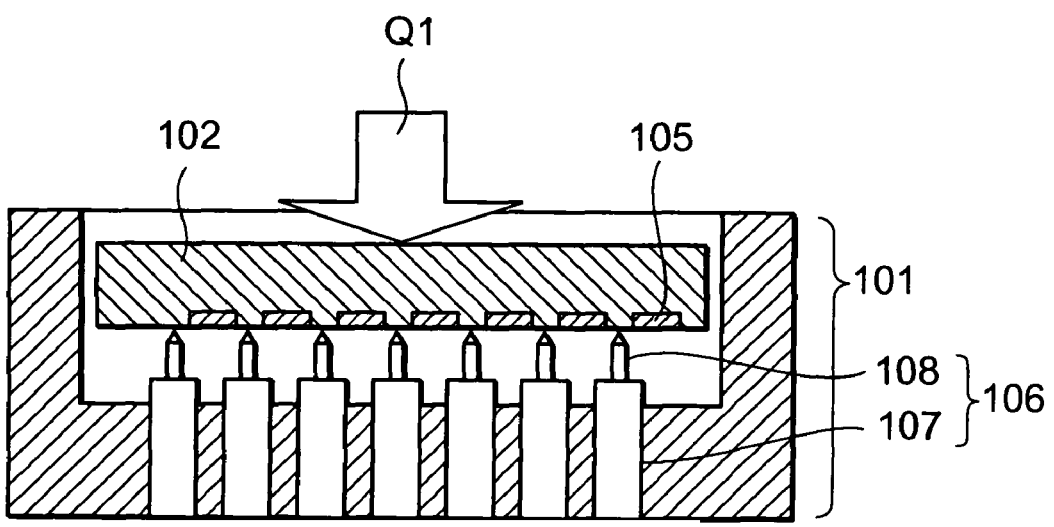
FIG. 14 shows the problem caused in the related art.
Figure 15A:
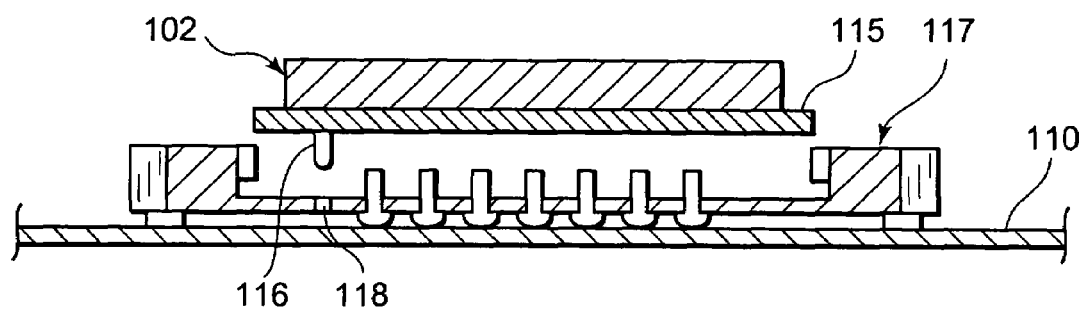
FIG. 15(a) shows a configuration of a related art described in a patent document 1.
Figure 15B:
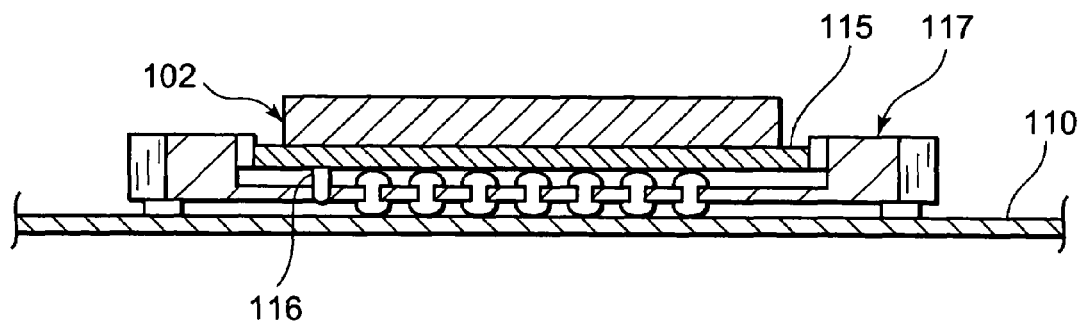
FIG. 15(b) shows a configuration of a related art described in the patent document 1.
Figure 16:
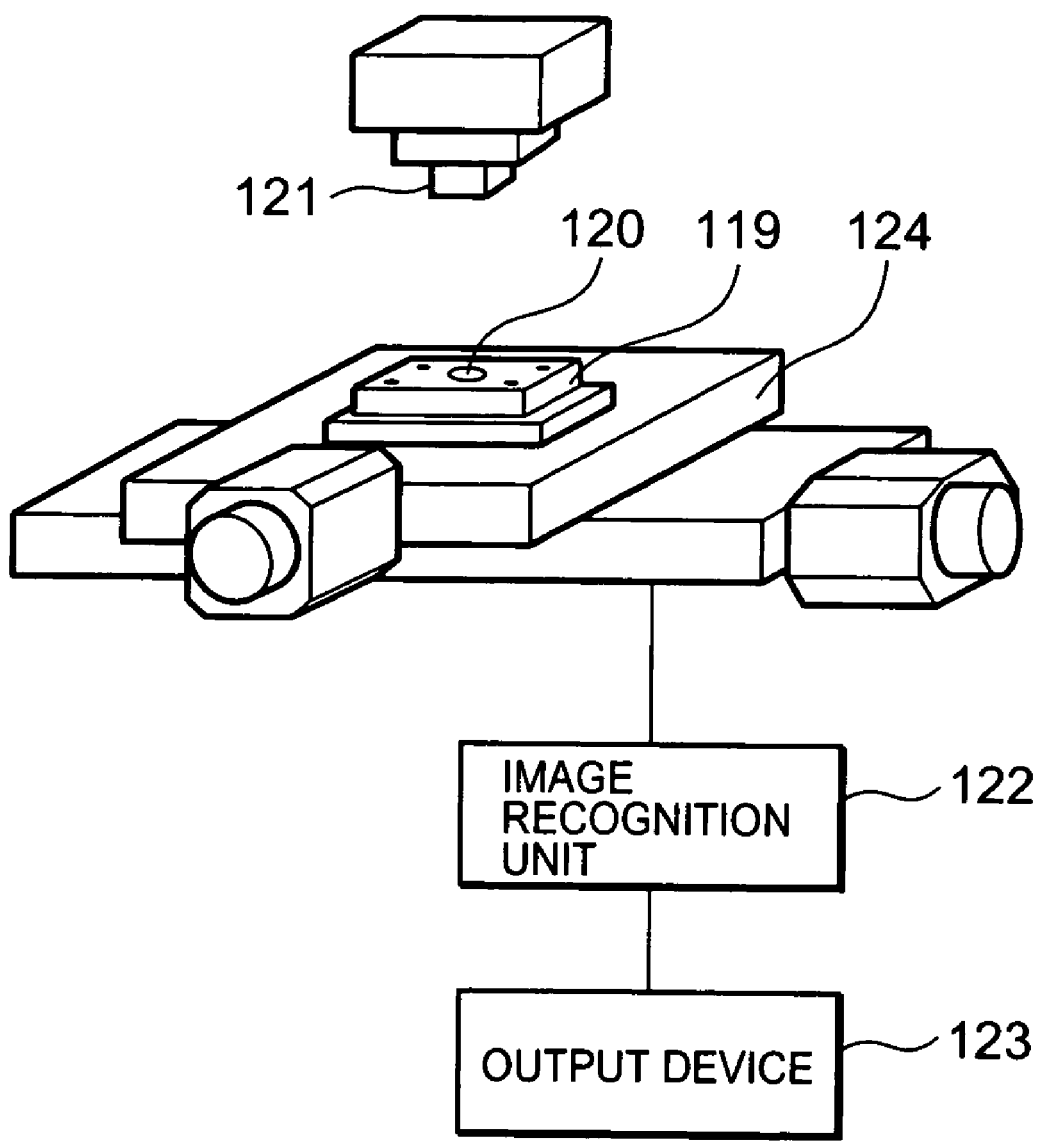
FIG. 16 shows a configuration of a related art described in a patent document 2.

Next, the microprocessor 39 that functions as the pre-load control device drives the servo motor Mp so as to lower the pressure arm 22 that functions as a pressure device, as shown in FIG. 9, and so as to apply a pre-load to the LGA 102 toward the bottom 104 of the concave space 13 by the end of the pressure arm 22 with the predetermined pre-load Q0 (at step s3).

Concretely, the microprocessor 39 outputs an instruction for movement to the servo motor Mp, detecting a value of a driving current of the servo motor Mp (i.e., reaction torque), instructs the pressure arm 22 to press the LGA 102 with its end, and stops the output of an instruction for movement to the servo motor MP when a value of the driving current, (i.e., the reaction torque) reaches a value equivalent to the pre-load Q0. As the driver 49 is substantially a servo circuit, the pre-load Q0 is held as it is in the form of an error value (deviation between a target position and a real position) in the servo circuit.

When the pre-load Q0 is applied, the needle 108*a* of the pin 2 arranged at the four corners of the concave space 13 retracts against pressure by the spring and the LGA 102 is also displaced downward. However, at this stage, the end of the other pin 2 (i.e., an end of the pin 2 provided with the relatively short needle 108*b*) is not touched to the LGA 102 yet. If force required to secure electric conduction between the pin 2 and one terminal 105 on the side of the LGA 102 is 0.5 N according to the example in the first embodiment, then the pre-load Q0 is equivalent to four times thereof, that is, approximately 2 N.

Next, after the microprocessor 39 resets a contact state validation flag F (at step S4), initializes a maximum value storage register Vmax to zero (at step s5) and initializes a value of retry counter C to zero (at step s6), it drives the servo motor Mx so as to synchronously turn the screws 29, 34 of the movable frame drive units for a crossfeed 24, 25, and positions the movable frame 19 in an initial position in a lateral direction in FIG. 9 (at step s7).

At this stage, as only the four pins 2 are touched to a lower surface of the LGA 102, frictional resistance caused between the end of the needle 108*a* and the lower surface of the LGA 102 is slight, the LGA 102 can be displaced with light force, and the lower surface of the LGA 102 and the terminal 105 are not damaged.

This initial position means a position in which the movable frame 19 is displaced on the left side in FIG. 9 from the reference position in design by a quantity equivalent to the maximum positional discrepancy of the position for each terminal 105 to be arranged based upon the outline of the LGA 102. Therefore, it is greatly possible in view of correspondence between the pin 2 of the LGA socket 1" and the terminal 105 on the side of the LGA 102 corresponding to the corresponding pin 2 that the terminal 105 is located on the left side in FIG. 9 of the pin 2. However, it is impossible that the terminal 105 is located on the right side in FIG. 9 of a position of the pin 2.

Next, the microprocessor 39 that functions as the first position component specifying device drives the servo motor Mx so as to synchronously turn the screws 29, 34 and so as to displace the movable frame 19 along the surface of the base member 18 by a minute quantity, for example, by a quantity equivalent to one pulse of the servo motor Mx in a rightward direction in FIG. 9 which is a first linear direction of the pins 2 as a result (at step s8), reads signals T1, T2, T3, T4 showing conduction between the pin 2 arranged at the four corners of the LGA socket 1" and the terminal 105 of the LGA 102 corresponding to each of the corresponding pins 2 from the detector 14 (a step s9). The microprocessor determines whether these values all exceed a threshold V0 or not (i.e., whether the combinations of the pins 2 arranged at the four corners and the terminal 105 of the LGA 102 corresponding to each of the corresponding pins 2 are all simultaneously turned conductive or not) (at step s10).

When the four combinations of the pin 2 and the terminal 105 are not all simultaneously turned conductive, the microprocessor 39 further determines whether the contact state validation flag F is set or not (at step s16). However, at this stage, as the contact state validation flag F is held reset, the microprocessor 39 further determines whether the current positions of the screws 29, 34, that is, the current positions of the movable frames in the lateral direction in FIG. 9, are located at a stroke end or not (a step s17).

The above-mentioned stroke end means a distance equivalent to the maximum positional discrepancy of an arranged position of each terminal 105 based upon the outline of the LGA 102.

When the current positions of the screws 29, 34, that is, the current positions of the movable frames 19 in the lateral direction in FIG. 9, are not located at the stroke end, the microprocessor 39 that functions as the first position component specifying device repeatedly executes the process of the steps s8 to s10 and the process of the steps s16 and s17.

A result of the determination in the step s17 being "true" in the meantime means that the combinations of the pin 2 arranged at the four corners and the terminal 105 of the LGA 102 corresponding to each of the corresponding pins 2 are not simultaneously turned conductive even if the movable frame 19 is displaced from the initial position in the lateral direction to the stroke end, that is, that the terminal 105 of the LGA 102 is displaced on this side of the pin 2 in the perpendicular direction with respect to the sectional figure shown in FIG. 9.

Therefore, in this case, the microprocessor 39 increments a value of the retry counter C by one (at step s18) and determines whether the current value of the retry counter C exceeds an allowed value n or not (at step s19).

When the value of the retry counter C does not exceed the allowed value n, the microprocessor 39 drives the servo motor My so as to synchronously turn the screws 37, 38 of the movable frame drive units for a longitudinal feed 26, 27 and so as to displace the movable frame 19 toward the back in the perpendicular direction with respect to the sectional figure shown in FIG. 9 by a smaller predetermined offset quantity than the maximum positional discrepancy as a result (at step s20), drives the servo motor Mx again so as to synchronously turn the screws 29, 34 of the movable frame drive units 24, 25, positions the movable frame 19 in the initial position in the lateral direction in FIG. 9 (the step s7), and similarly repeatedly executes the process of the steps s8 to s10 and the process of the steps s16 and s17 as retry operation.

For a value of the allowed value n, a value acquired by rounding up a numeric value which is acquired by dividing the maximum positional discrepancy by the predetermined offset quantity described in the step s20 and turning it an integer, is suitable.

The retry operation is allowed up to n times at the maximum. However, a case that the combinations of the pin 2 arranged at the four corners and the terminal 105 of the LGA 102 corresponding to each of the corresponding pins 2 are not simultaneously turned conductive even if the retry operation is repeated by n times means that suitable conduction is not acquired even if the movable frame 19 is displaced in the longitudinal direction toward the back in the direction perpendicular to the paper surface by the distance equivalent to the maximum positional discrepancy from the initial position on this side in the perpendicular direction with respect to the sectional figure shown in FIG. 9 using the predetermined offset quantity for a scale, repeatedly displacing the movable frame 19 laterally from the initial position on the left side in the lateral direction in FIG. 9 to the stroke end, that is, that conduction is not acquired even if the LGA 102 is displaced in the longitudinal and lateral directions in a range of the maximum positional discrepancy. In this case, as the LGA socket 1" and the LGA 102 themselves have great possibility of being abnormal, the microprocessor 39 instructs the display 45 to display an error message and relinquishes the continuation of the processing related to mounting the LGA 102.

In the meantime, when it is verified that all the combinations of the pin 2 arranged at the four corners and the terminal 105 of the LGA 102 corresponding to each of the corresponding pins 2 are simultaneously conductive and a result of the determination in the step s10 is turned "true" while the process of the steps s8 to s10 and the process of the steps s16 and s17 are repeatedly executed, the microprocessor 39, that functions as the first position component specifying device, stores that conduction for the present is acquired by setting the contact state validation flag F (a step S11), further computes an added value of the signals T1, T2, T3, T4 read in the process in the step s9 immediately before the process from the detector 14, that is, a state of overall conduction between the pins 2 arranged at the four corners and the LGA 102 corresponding to each of the corresponding pins 2. The microprocessor also determines whether the added value exceeds the current value of the maximum value storage register Vmax or not (at step s12).

Only when the added value exceeds the current value of the maximum value storage register Vmax, the microprocessor 39 that functions as the first position component specifying device updates a value of the maximum value storage register Vmax and stores the added value (at step s13).

Besides, the microprocessor 39 that functions as the first position component specifying device reads the current positions of the screws 29, 34 in the lateral direction in FIG. 9, that is, the current positions of the movable frames 19 in the lateral direction from a pulse coder Px of the servo motor Mx only when the added value exceeds the current value of the maximum value storage register Vmax (a step s14), updates a value of an optimum lateral position storage register Rx and stores this value (at step S15), and returns control to the process in the step s8.

In the meantime, when the added value of the signals T1, T2, T3, T4 from the detector 14 does not exceed the current value of the maximum value storage register Vmax and a result of the determination in the steps 12 is "false", the microprocessor 39 skips the process of the steps s13 to s15 and returns control to the process in the step s8.

When it is verified as described above that all the combinations of the pins 2 arranged at the four corners and the terminals 105 of the LGA 102 corresponding to each of the corresponding pins 2 are simultaneously turned conductive and the contact state validation flag F is once set, the process of the steps s8 to s12 or the process of the steps s8 to s15 is repeatedly executed by the microprocessor 39 that functions as the first position component specifying device as long as conduction for the present continues to be verified in all the combinations of the pin 2 arranged at the four corners and the terminal 105 of the LGA 102 corresponding to each of the corresponding pins 2, that is, as long as a result of the determination in the step s10 continues to be "true".

That is, until a left end of the terminal 105 of the LGA 102 passes the right side of the pin 2 since a right end of the terminal 105 of the LGA 102 shown in FIG. 9 is brought close to the pin 2 from the left side in FIG. 9 and is actually touched, the process of the steps s8 to s12 or the steps s8 to s15 is repeatedly executed. In a section in which the LGA 102 is moved, it is in a moment in which the center in a lateral direction of the terminal 105 is touched to the end of the pin 2 that conduction between the terminal 105 of the LGA 102 and the pin 2 is turned optimum. Finally, the added value of T1, T2, T3, T4 at this time is held as it is in the maximum value storage register Vmax as a maximum value, similarly, the current positions Px of the movable frames 19 in a moment in which the center in the lateral direction of the terminal 105 is touched to the end of the pin 2 are held as they are in the optimum lateral position storage register Rx.

When the left end of the terminal 105 of the LGA 102 passes the right side of the pin 2, conduction between the pin 2 and the terminal 105 corresponding to the corresponding pin 2 is not assured, a result of the determination in the step s10 is turned "false".

Next, the microprocessor 39 determines whether the contact state validation flag F is set or not (the step s16). However, as the contact state validation flag F is already set at this stage, a result of the determination in the step s16 is "true", the microprocessor 39 that functions as a part of the movable frame positioning device drives the servo motor Mx so as to synchronously turn the screws 29, 34 of the movable frame drive units for a crossfeed 24, 25 and so as to displace the movable frame 19 in the lateral direction in FIG. 9 as a result. Microprocessor 39 positions the movable frame 19 and the LGA 102 in a position specified by the first position component specifying device, that is, in a position stored in the optimum lateral position storage register Rx and in a position in which the center in the lateral direction of the terminal 105 is touched to the end of the pin 2 (at step s21).

Next, the microprocessor 39 initializes the maximum value storage register Vmax to zero again (at step s22), drives the servo motor My so as to synchronously turn the screws 37, 38 of the movable frame drive units for a longitudinal feed 26, 27, and positions the movable frame 19 in an initial position in the perpendicular direction with respect to the sectional figure shown in FIG. 9 again (at step s23) The initial position means a position in which the movable frame 19 is displaced on this side in the perpendicular direction with respect to the sectional figure shown in FIG. 9 from the reference position in design by the quantity equivalent to the maximum positional discrepancy of the arranged position of each terminal 105 based upon the outline of the LGA 102.

Next, the microprocessor 39, that functions as the second position component specifying device, drives the servo motor My so as to synchronously turn the screws 37, 38 of the movable frame drive units for a longitudinal feed 26, 27 and so as to displace the movable frame 19 along the surface of the base member 18 by minute quantity, for example, by quantity equivalent to one pulse of the servo motor My toward the back in the perpendicular direction with respect to the sectional figure shown in FIG. 9 which is a second linear direction of the pins 2 as a result (at step s24), Microprocessor 39 reads the signals T1, T2, T3, T4 showing conduction between the pin 2 arranged at the four corners of the LGA socket 1" and the terminal 105 of the LGA 102 corresponding to each of the corresponding pins 2 from the detector 14 (a step s25), and determines whether these values all exceed the threshold V0 or not. In short, it is determined whether all the combinations of the pin 2 arranged at the four corners and the terminal 105 of the LGA 102 corresponding to each of the corresponding pins 2 are simultaneously turned conductive or not (a step s26).

If all the four combinations of the pin 2 and the terminal 105 are not simultaneously turned conductive, then the microprocessor 39 further determines whether the current positions of the screws 37, 38, that is, the current positions of the movable frames 19 in the perpendicular direction with respect to the sectional figure shown in FIG. 9, reach a stroke end or not (a step s31).

The stroke end in this case means a distance equivalent to the maximum positional discrepancy of the arranged position of each terminal 105 based upon the outline of the LGA 102.

If the current positions of the screws 37, 38, that is, the current positions of the movable frames 19 in the perpendicular direction with respect to the sectional figure shown in FIG. 9, do not reach the stroke end, then the microprocessor 39 that functions as the second position component specifying device similarly repeatedly executes the process of the steps s24 to s26 and the process in the step s31.

When it is verified that all the combinations of the pin 2 arranged at the four corners and the terminal 105 of the LGA 102 corresponding to each of the corresponding pins 2 are simultaneously turned conductive and a result of the determination in the step s26 is turned "true" while the process of the steps s24 to s26 and the process in the step s31 are repeatedly executed, the microprocessor 39, that functions as the second position component specifying device, computes the added value of the signals T1, T2, T3, T4 from the detector 14 read in the process in the step s25 immediately before the step, that is, overall conduction between the pin 2 arranged at the four corners and the LGA 102 corresponding to each of the corresponding pins 2. Microprocessor 39 determines whether the added value exceeds the current value of the maximum value storage register Vmax or not (at step s27).

Only when the added value exceeds the current value of the maximum value storage register Vmax, the microprocessor 39, that functions as the second position component specifying device, updates the current value of the maximum value storage register Vmax and stores the added value (at step s28).

Besides, the microprocessor 39, that functions as the second position component specifying device, reads the current positions of the screws 37, 38 in the perpendicular direction with respect to the sectional figure shown in FIG. 9, that is, the current positions of the movable frames 19 in the longitudinal direction from the pulse coder Py of the servo motor My only when the added value exceeds the current value of the maximum value storage register Vmax (at step s29), updates the current value of the optimum lateral position storage register Ry and stores this value (at step s30), and returns control to the process in the step s24 again.

In the meantime, when the added value of the signals T1, T2, T3, T4 from the detector 14 does not exceed the current value of the maximum value storage register Vmax and a result of the determination in the step s27 is turned "false", the microprocessor 39 skips the process of the steps s28 to s30, and returns control to the process in the step s24 again.

When it is once verified that all the combinations of the pins 2 arranged at the four corners and the terminal 105 of the LGA 102 corresponding to each of the corresponding pins 2 are simultaneously turned conductive as described above, the process of the steps s24 to s27 or the process of the steps s24 to s30 is repeatedly executed by the microprocessor 39, that functions as the second position component specifying device, as long as conduction for the present continues to be verified in all the combinations of the pin 2 arranged at the four corners and the terminal 105 of the LGA 102 corresponding to each of the corresponding pins 2, that is, as long as a result of the determination in the step s26 continues to be "true".

That is, until an end on this side of the terminal 105 of the LGA 102 passes the pin 2 since a rear end of the terminal 105 of the LGA 102 shown in FIG. 9 is brought close to the pin 2 from this side in FIG. 9 and is actually touched, the process of the steps s24 to s27 or the process of the steps s24 to s30 is repeatedly executed. In a section in which the LGA 102 is moved, it is in a moment in which the center in a longitudinal direction of the terminal 105 is touched to the end of the pin 2 that conduction between the terminal 105 of the LGA 102 and the pin 2 is optimum. Finally, the added value of T1, T2, T3, T4 at this time is held as it is in the maximum value storage register Vmax as a maximum value, and similarly, the current positions Py of the movable frames 19 in the moment in which the center in the longitudinal direction of the terminal 105 is touched to the end of the pin 2, are held as they are in the optimum lateral position storage register Ry.

When the end on this side of the terminal 105 of the LGA 102 passes the pin 2 and conduction between the pin 2 and the terminal 105 corresponding to the corresponding pin 2 is not assured, a result of the determination in the step s26 is turned "false", further when the current positions of the screws 37, 38, that is, the current positions of the movable frames 19 in the perpendicular direction with respect to the sectional figure shown in FIG. 9 reach the stroke end and a result of the determination in the step s31 is turned "true", the microprocessor 39, that functions as a part of the movable frame positioning device, drives the servo motor My so as to synchronously turn the screws 37, 38 of the movable frame drive units 26, 27 and so as to displace the movable frames 19 in the longitudinal direction in FIG. 9 as a result. Microprocessor 39 positions the movable frames 19 and the LGA 102 in a position specified by the second position component specifying device, that is, in a position stored in the optimum lateral position storage register Ry and in a position in which the center in the longitudinal direction of the terminal 105 is touched to the end of the pin 2 (at step s32).

As described above, the LGA 102 is displaced in the first and second linear directions of the pins 2 by longitudinally and laterally displacing the movable frames 19 of the LGA socket 1" along the surface of the base member 18, checking conduction between the pins 2 arranged at the four corners of the bottom 104 of the concave space 13 of the LGA socket 1" and the terminal 105 corresponding to each of the corresponding pins 2, the positions in which conduction is verified in all the combinations to be checked of the pin 2 and the terminal 105, particularly, the positions in which the center in the longitudinal and lateral directions of the terminal 105 is touched to the end of the pin 2 and optimum conduction is assured are stored as optimum positions in mounting the LGA 102 on the movable frames 19, and positioning control over the movable frames 19 is completed.

Next, the microprocessor 39 that functions as the press-fit control device outputs a further displacement instruction to the servo motor Mp so as to press the LGA 102 by the end of the pressure arm 22 with pressure equivalent to the load Q1, so as to completely press-fit the outline of the LGA 102 onto the movable frames 19 as a result and so as to mount and fix the LGA 102 into the concave space 13 of the LGA socket 1" as a result (a step s33).

At this stage, the LGA 102 further goes down, is completely fitted into the concave space 13, and all the pins 2 including the pins 2 provided with each relatively short needle 108b are touched to the terminal 105 corresponding to each pin. If force required to secure electric conduction between the pin 2 and one terminal 105 on the side of the LGA 102 is 0.5 N as in the first exemplary embodiment, then the load Q1 is 500 times of the force, that is, 250 N when the number of the pins 2 is 500. However, in the third exemplary embodiment, as force for press-fitting the LGA 102 onto each inner circumference of the movable frames 19 is also required, the actual load Q1 has a slightly larger value than 250 N.

Next, the microprocessor 39 drives the servo motor Mz so as to elevate the elevating/lowering head of the adjusting unit 17 and so as to return it to the retracted position (at step s34), further drives the servo motor Mx and the servo motor My so as to return the screws 29, 34, 37, 38 of the movable frame drive unit 23 to home positions (at step s35), and drives the servo motor Mp so as to return the pressure arm 22 to a standby position (at step s36).

That is, in the LGA socket 1" in the third exemplary embodiment, the mounted position justifying device for justifying the mounted position of the LGA 102 in the linear directions of the pins 2 is configured by the base member 18 forming the bottom 104 of the concave space 13 and the movable frames 19, movably attached along the surface of the base member 18.

The mounted position fixing unit for holding the justified mounted position of the LGA 102 is configured by the inner circumference of the movable frame 19, that allows the approach of the LGA 102 in a press-fitted state to prevent the LGA 102 from falling and the needles 108a, 108b of the multiple pins 2 which are touched to each of the terminals 105 in a state pressed by the spring not shown and are compressed. Displacement along the surface of the base member 18 in the mounted position of the LGA 102 between the movable frame 19 is prevented by mechanical frictional resistance that acts between the needle 108a or 108b and the surface on which the terminals are arranged of the LGA 102.

In the third embodiment, the processing when the LGA 102 is mounted on the LGA socket 1" utilizing the adjusting unit 17 has been described. However, the movable frames 19 and the LGA 102 may be also positioned, manually displacing the movable frames 19 of the LGA socket 1" on the base member 18 and checking conduction on the detector 14.

Further, if the controller 38 shown in FIG. 6 and the algorithm of the processing shown in FIGS. 7 and 8 are applied to the LGA socket 1' shown in FIG. 4, then the motors M1, M2 in the first embodiment are driven in place of the servo motor Mx in the third embodiment and the motors M3, M4 in the first embodiment are driven in place of the servo motor My in the third embodiment, the LGA 102 can be also positioned in a position in which conduction is optimum utilizing the LGA socket 1' shown in FIG. 4.

According to the socket for high density terminals disclosed in the present application, as the mounted position of the electronic component can be displaced in the linear directions of the pins in the socket for high density terminals, in addition, a state in which justification is completed is held and the electronic component can be fixed onto the socket for high density terminals, electric contact between the terminal of the electronic component and the pin of the socket for high density terminals can be secured even if misregistration based upon the outline of the electronic component occurs in the terminals of the electronic component.

Therefore, the electronic component itself is not required to be precisely worked, a positioning pin is also not required to be newly attached, and conduction between the electronic component and the socket for high density terminals can be assured at a low cost.

Besides, as the method of mounting the electronic component according to the invention particularly includes longitudinally and laterally displacing the electronic component in the linear directions of the pins, checking conduction between the pins arranged at at least three of the four corners of the bottom of the concave space of the socket for high density terminals and the terminal corresponding to each of the corresponding pins, mounting and holding the electronic component in the positions in which conduction between the pin and the terminal respectively for conduction to be checked is all verified, the deviation in a posture of the electronic component for the socket for high density terminals and misregistration are securely prevented and electric contact between the terminal of the electronic component and the pin of the socket for high density terminals can be secured.

Further, in the electronic component adjusting unit according to the invention, as particularly, the positions of the movable frames in the first linear direction when the socket for high density terminals in which the electronic component is fitted is displaced in the first linear direction of the pins and conduction is turned optimum, and the positions of the movable frames in the second linear direction when the socket for high density terminals is displaced in the second linear direction that crosses the first linear direction and conduction is turned optimum, are computed by the first and second position component specifying devices, the electronic component is urged toward the bottom of the concave space with the load after the movable frames are positioned by the movable frame positioning device in the positions specified by the first and second position component specifying devices and the electronic component is press-fitted and fixed between the opposite movable frames. The deviation in a posture of the electronic component for the socket for high density terminals and misregistration is securely prevented. Electric contact between the terminal of the electronic component and the pin of the socket for high density terminals also can be secured, and in addition, optimum conduction can be assured.

Further, it is noted that applicant's intent is to encompass equivalents of all claim elements, even if amended later during prosecution.

What is claimed is:

1. An apparatus, comprising:
a plurality of pins which include a longitudinal axis, each of said pins to be respectively electronically contacted with each of a plurality of terminals of an electronic component, by pressing each of said terminals onto each of said pins, said pins including a plurality of long pins having a longer length in the longitudinal axis than that of others of said pins; and
an adjusting unit which in order presses said electronic component until ends of said long pins contact a terminal surface of said electronic component while ends of said others of said pins remain apart from said surface, adjusts a position of said electronic component in a direction parallel to an extension of a row of said pins so that said each of said terminals corresponds to each of said long pins, respectively, and presses said electronic component further until ends of all said pins including said others of said pins contact corresponding terminals respectively.

2. The apparatus according to claim 1, wherein one of said long pins corresponds to a terminal located on an outer region of said electronic component.

3. The apparatus according to claim 1, further comprising:
a detector which detects that one of said long pins electrically contacts with a terminal corresponding to said long pin.

4. The apparatus according to claim 1, further comprising:
a socket which includes said pins,
wherein said electronic component is inserted into said socket, and said each of said terminals contacts with said each of said pins, respectively, and
wherein said socket includes a space between an interior wall of said socket and said electronic component.

5. The apparatus according to claim 1, wherein said adjusting unit comprises:
a first adjusting element; and
a second adjusting element which is located on an opposite side with respect to said first adjusting element,
wherein at least one of said first adjusting element and said second adjusting element adjusts said position of said electronic component so that said each of said terminals corresponds to said each of said pins respectively, and
wherein said first adjusting element and said second adjusting element press said electronic component for substantially fixing said position of said electronic component in an adjusted position.

6. The apparatus according to claim 5, wherein said adjusting unit further comprises:
a driving element which drives said first adjusting element and said second adjusting element for adjusting said position of said electronic component.

7. The apparatus according to claim 1, wherein said adjusting unit further comprises:
a socket which includes said pins, said electronic component being inserted into said socket, and
wherein said socket further comprises:
a frame movable for adjusting said position of said electronic component.

8. A method, comprising in order:
inserting an electronic component including a plurality of terminals, into a socket, which includes a plurality of pins including a longitudinal axis, said pins including long pins having a longer length in said longitudinal axis than that of others of said pins, from a direction corresponding to said longitudinal axis;
pressing said electronic component until ends of said long pins contact a terminal surface of said electronic component while ends of said others of said pins remain apart from said surface;
adjusting a position of said electronic component in a direction parallel to an extension of a row of said pins so that each of said terminals corresponds to each of said long pins respectively; and
pressing said electronic component further until ends of all said pins including said others of said pins contact corresponding terminals respectively.

9. The method according to claim 8, wherein said adjusting said position of said electronic component comprises:
automatically adjusting said position of said electronic component so that each of said terminals corresponds to each of said pins respectively.

10. The method according to claim 8, wherein said inserting said electronic component further comprises:
inserting said electronic component into said socket which further includes a frame movable for adjusting said position of said electronic component,
wherein said adjusting said position of said electronic component further comprises:
adjusting said position of said electronic component by moving said frame.

11. The method according to claim 8,
wherein said socket holds said pins, and
wherein the adjusting the position of said electronic component comprises adjusting a relative position of the socket to said electronic component.

12. The method according to claim 8, wherein the adjusting the position of said electronic component comprises screwing a plurality of adjustable screws that contact edges of said electronic component.

13. The method according to claim 12, wherein a pair of said adjustable screws contacts opposing side edges of said electronic component to adjust said electronic component in the direction parallel to the extension of the row of said pins, and
wherein one of said adjustable screws contacts a lower edge of said electronic compound to adjust said electronic component in a direction of the longitudinal axis of said pins.

14. The method according to claim 8, wherein said adjusting comprises adjusting a relative position of the socket to said electronic component.

15. The method according to claim 8, wherein said method further comprises:
adjusting said electronic component in said direction corresponding to said longitudinal axis by an adjustable screw that contacts a lower edge of said electronic component,
wherein said adjusting said position of said electronic component in the direction parallel to the extension of said row of said pins comprises:
pressing opposing side edges of said electronic compound by a pair of adjustable screws.

* * * * *